US012137592B2

(12) United States Patent
Sui et al.

(10) Patent No.: US 12,137,592 B2
(45) Date of Patent: Nov. 5, 2024

(54) DISPLAY SUBSTRATE AND DISPLAY DEVICE

(71) Applicant: BOE TECHNOLOGY GROUP CO., LTD., Beijing (CN)

(72) Inventors: Kai Sui, Beijing (CN); Jinxiang Xue, Beijing (CN); Zhongyuan Sun, Beijing (CN); Qian Jin, Beijing (CN); Xiaofen Wang, Beijing (CN)

(73) Assignee: BOE TECHNOLOGY GROUP CO., LTD., Guangdong (CN)

( * ) Notice: Subject to any disclaimer, the term of this patent is extended or adjusted under 35 U.S.C. 154(b) by 802 days.

(21) Appl. No.: 17/289,680

(22) PCT Filed: Aug. 3, 2020

(86) PCT No.: PCT/CN2020/106559
§ 371 (c)(1),
(2) Date: Apr. 28, 2021

(87) PCT Pub. No.: WO2021/036696
PCT Pub. Date: Mar. 4, 2021

(65) Prior Publication Data
US 2021/0408161 A1    Dec. 30, 2021

(30) Foreign Application Priority Data

Aug. 23, 2019  (CN) .......................... 201910783199.2

(51) Int. Cl.
*H10K 59/35* (2023.01)
*H10K 77/10* (2023.01)

(52) U.S. Cl.
CPC ......... *H10K 59/353* (2023.02); *H10K 59/352* (2023.02); *H10K 77/111* (2023.02)

(58) Field of Classification Search
CPC .. H05K 59/352; H05K 59/353; H10K 77/111; G09F 9/301; Y02E 10/549
See application file for complete search history.

(56) References Cited

U.S. PATENT DOCUMENTS 7,733,359 B1    6/2010  Hagge et al.
2009/0079351 A1  3/2009  Choi et al.
(Continued)

FOREIGN PATENT DOCUMENTS

CN    101393924 A    3/2009
CN    104465712 A    3/2015
(Continued)

OTHER PUBLICATIONS

Third Office Action for Chinese Application No. 201910783199.2, dated Aug. 30, 2021, 8 Pages.
(Continued)

*Primary Examiner* — Calvin Y Choi
(74) *Attorney, Agent, or Firm* — Brooks Kushman P.C.

(57) ABSTRACT

The present disclosure provides a display substrate and a display device, wherein the display substrate includes a substrate body, the substrate body includes a plurality of island portions spaced apart from each other, a plurality of connection areas connecting the plurality of island portions, and a penetration portion penetrating the substrate body among the plurality of connection areas, at least a portion of each edge of the island portion is connected with the connection area; each island portion is respectively provided with a plurality of pixel groups, each pixel group includes a first pixel unit and a second pixel unit which are adjacently arranged along a first direction, an arrangement of the sub-pixels in the first pixel unit is different from an arrangement of the sub-pixels in the second pixel unit, the plurality (Continued)

of pixel groups form an n×m arrangement on the island portion and cover the whole island portion.

20 Claims, 13 Drawing Sheets

(56) References Cited

U.S. PATENT DOCUMENTS

| | | | |
|---|---|---|---|
| 2015/0009104 A1 | 1/2015 | Kim et al. | |
| 2015/0015465 A1 | 1/2015 | Gong | |
| 2016/0170517 A1* | 6/2016 | Donnelly | G06F 3/0412 345/174 |
| 2017/0003440 A1 | 1/2017 | Kim et al. | |
| 2017/0279057 A1 | 9/2017 | Park et al. | |
| 2018/0052493 A1 | 2/2018 | Hong et al. | |
| 2018/0261654 A1 | 9/2018 | Hwang et al. | |
| 2019/0131358 A1 | 5/2019 | Yang et al. | |
| 2020/0212124 A1* | 7/2020 | Shao | H10K 59/122 |
| 2021/0399064 A1* | 12/2021 | Nakamura | H10K 59/122 |

FOREIGN PATENT DOCUMENTS

| | | |
|---|---|---|
| CN | 106597802 A | 4/2017 |
| CN | 106653799 A | 5/2017 |
| CN | 106981501 A | 7/2017 |
| CN | 107221550 A | 9/2017 |
| CN | 206564254 U | 10/2017 |
| CN | 107710885 A | 2/2018 |
| CN | 207966986 U | 10/2018 |
| CN | 109817685 A | 5/2019 |
| CN | 109841660 A | 6/2019 |
| CN | 110518036 A | 11/2019 |

OTHER PUBLICATIONS

International Search Report and Written Opinion for Application No. PCT/CN2020/106559, dated Oct. 22, 2020, 9 Pages.

* cited by examiner

DISPLAY SUBSTRATE AND DISPLAY DEVICE

CROSS-REFERENCE TO RELATED APPLICATIONS

This application is the U.S. national phase of PCT Application No. PCT/CN2020/106559 filed on Aug. 3, 2020, which claims priority to Chinese Patent Application No. 201910783199.2 filed on Aug. 23, 2019, which are incorporated herein by reference in their entireties.

TECHNICAL FIELD

The invention relates to the field of display technology, in particular to a display substrate and a display device.

BACKGROUND

Currently various flat panel display devices are available with excellent characteristics such as thin, light and low power consumption. Recently, flexible display devices that can be folded or rolled have been developing. And further, stretchable display devices capable of changing their shapes variously are currently being developed.

SUMMARY

The embodiments of the present disclosure provide a display substrate, including:

A flexible substrate body including a plurality of island portions spaced apart from each other, a plurality of connection areas connecting the plurality of island portions, and a penetration portion penetrating the substrate body among the plurality of connection areas, wherein at least a portion of each edge of the island portion is connected with the connection areas;

Each island portion is respectively provided with a plurality of pixel groups, each pixel group comprises a first pixel unit and a second pixel unit which are adjacently arranged along a first direction, the arrangement mode of the sub-pixels in the first pixel unit is different from the arrangement mode of the sub-pixels in the second pixel unit, the plurality of pixel groups form an n×m arrangement mode on the island portion and cover the whole island portion; the first direction is a direction parallel to one edge of the island;

Wherein n represents the number of the pixel groups in the row direction, m represents the number of the pixel groups in the column direction, and n and m are integers greater than or equal to 1 respectively.

Alternatively, both the sub-pixels within the first pixel unit and the sub-pixels within the second pixel unit are arranged to form a quadrangular pixel unit area.

Alternatively, the arrangement of the mirrored pixels of the first pixel unit mirrored along a straight line parallel to the first direction is the same as the arrangement of the sub-pixels in the second pixel unit.

Alternatively, the sub-pixels within the first pixel unit and the second pixel unit are arranged to form a square pixel unit area.

Optionally, an area of the pixel unit area formed by the sub-pixels arranged in the first pixel unit is equal to an area of the pixel unit area formed by the sub-pixels arranged in the second pixel unit.

Optionally, the pixel unit arrangement area formed by the island is quadrilateral, and the quadrangular pixel unit area formed by the combination arrangement of at least three sub-pixels within the first pixel unit included in the pixel group is matched with the pixel unit arrangement area.

Optionally, the first pixel unit comprises four subpixels, wherein at least three subpixels in the four subpixels have different colors;

The first sub-pixel and the second sub-pixel respectively cover two ends of a first diagonal line of a pixel unit area where the first pixel unit is located, and the third sub-pixel and the fourth sub-pixel respectively cover two ends of a second diagonal line of the pixel unit area.

Optionally, a sub-pixel of a third color within the first pixel unit is located adjacent to a sub-pixel of the third color within the second pixel unit.

Optionally, each of the four sub-pixels is a quadrilateral. Alternatively, the first sub-pixel and the second sub-pixel are both concave hexagons, and the third sub-pixel and the fourth sub-pixel are both quadrilaterals.

Optionally, the third sub-pixel and the fourth sub-pixel are sub-pixels of the same color, the first sub-pixel, the second sub-pixel and the third sub-pixel are sub-pixels of different colors respectively, the area of the third sub-pixel is equal to the area of the fourth sub-pixel, and the area of the first sub-pixel is equal to the area of the second sub-pixel.

Optionally, the area of the first sub-pixel is larger than the area of the third sub-pixel.

Optionally, the first pixel unit comprises three sub-pixels which are sub-pixels of different colors respectively;

A first sub-pixel of the three sub-pixels covers a first end of a first diagonal line of a pixel unit area where the first pixel unit is located and a first end of a second diagonal line, a second sub-pixel covers a second end of the first diagonal line of the pixel unit area, and a third sub-pixel covers a second end of the second diagonal line of the pixel unit area.

Alternatively, each of said sub-pixels is quadrilateral.

Alternatively, the first sub-pixel is a concave hexagon, and the second sub-pixel and the third sub-pixel are quadrilateral.

Optionally, at least one of the three sub-pixels consists of at least two sub-pixel units of the same color.

Optionally, the area of the first sub-pixel is larger than the area of the second sub-pixel and the area of the third sub-pixel.

Optionally, the first pixel unit includes three sub-pixels which are sub-pixels of different colors respectively;

The first sub-pixel and the second sub-pixel respectively cover two ends of a first diagonal line of a pixel unit area where the first pixel unit is located, and the third sub-pixel is arranged between the first sub-pixel and the second sub-pixel and covers a second diagonal line of the pixel unit area and is arranged along the second diagonal line.

Optionally, the first sub-pixel and the second sub-pixel are triangular;

The third sub-pixel is oblong.

Optionally, the first sub-pixel and the second sub-pixel are triangular, the third sub-pixel includes at least two sub-pixel units of the same color, and each sub-pixel unit is semielliptical or pentagonal.

Optionally, the area of the first sub-pixel is equal to the area of the second sub-pixel.

Optionally, the connection area is arranged between every two adjacent island portions; a first end of the connection area is connected with a first top end of a first edge of a first island portion in two adjacent island portions; the second end of the connection area is connected with the second top ends of the second edges of the second island portions in the two adjacent island portions; the second edge is opposite to the first edge, and the second top end is one end of the second edge far away from the first top end.

Embodiments of the present disclosure also provide a display device including a display substrate as described in any one of the above.

Optionally, the substrate body in the display device has a stretched state stretched in the first direction and/or a second direction perpendicular to the first direction, wherein the shape of the penetrating portion changes when the substrate body is stretched.

DETAILED DESCRIPTION

In order that the technical problems, solutions, and advantages to be solved by the present disclosure will become more apparent, a more particular description will be rendered by reference to the appended drawings and specific embodiments.

At present, a stretching display device mostly adopts an island (display unit) bridge (line connection unit) connection mode, and a certain stretching rate can be realized through stretching of a hollowed-out area. However, in the related art stretch display device, the arrangement of the pixel units on the display unit area cannot make full use of the island area, and there is a problem that the PPI of the entire display panel is low. Moreover, due to the fact that the hollow area exists in the stretching display device, the PPI is much lower than that of the display panel without the hollow area in the same area size, and if the area of the display unit area cannot be fully utilized, the finally presented display effect is poor.

In order to solve the problems of low resolution and poor display effect caused by the fact that the arrangement of the pixel units cannot fully utilize the layout area of the display units in the display device in the related art, the embodiment of the invention provides a display substrate which comprises two pixel units which are adjacently arranged along a first direction in a plurality of arranged pixel groups, wherein the arrangement modes of sub-pixels in the two pixel units are different and multiple The pixel groups are sequentially arranged on the island portion of the display substrate and cover the whole island portion, so that the pixel unit area formed by the pixel groups can achieve excellent display effect, the pixel unit area formed by combining the pixel groups is matched with the pixel unit arrangement area of the island portion, the full utilization of the pixel unit arrangement area on the island portion is guaranteed, and the purposes of improving the resolution ratio and the display effect can be achieved.

Alternatively, the display substrate described in embodiments of the present disclosure may be used in a stretch display device.

Figure 1:
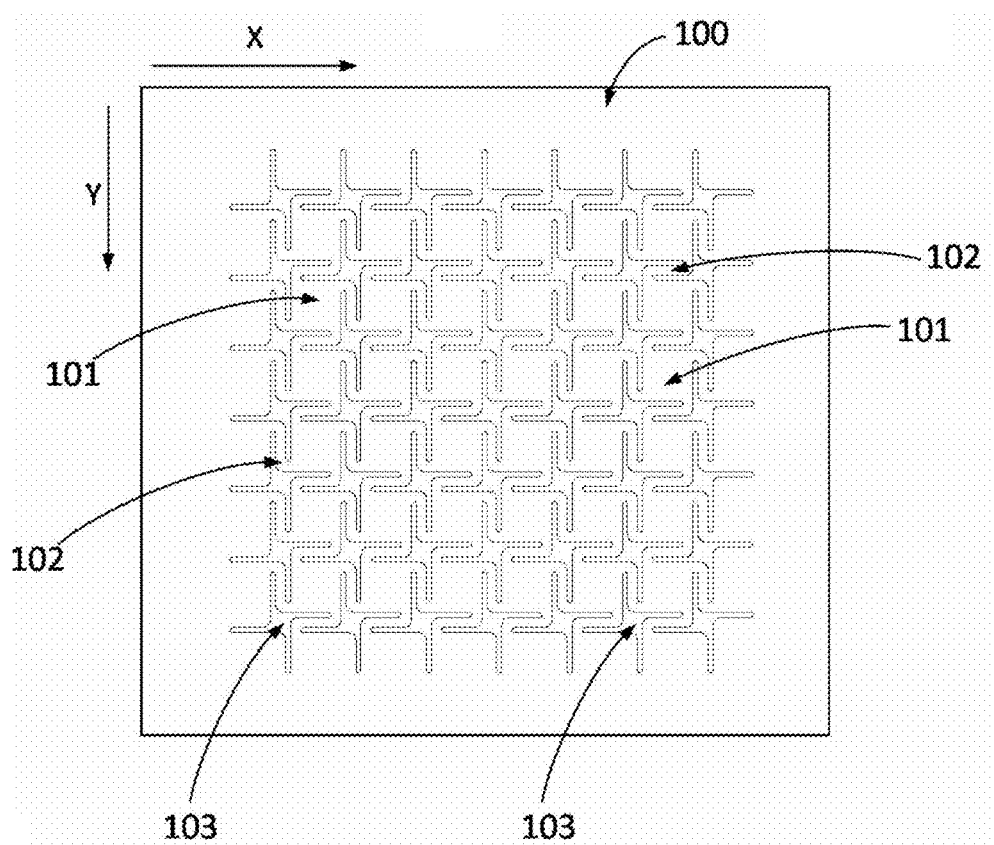
FIG. 1 is a schematic structural view of one embodiment of a substrate body in a display substrate according to an embodiment of the present disclosure.

Wherein, when the display substrate is applied to a stretch display device, as shown in FIG. 1, the display substrate includes: a substrate body 100 made of a flexible material, wherein the substrate body 100 can be twisted, bent, folded and/or curled, etc. Alternatively, the substrate body may be made of ultra-thin glass, metal or plastic.

In addition, the substrate body 100 includes a plurality of island portions 101 spaced apart from each other, a plurality of connection areas 102 connecting the plurality of island portions 101, and a penetration portion 103 penetrating the substrate body 100 among the plurality of connection areas 102.

Alternatively, the plurality of is lands 101 are repeatedly arranged along a first direction X and a second direction Y different from the first direction X to form a planar mesh pattern. Alternatively, the first direction X is perpendicular to the second direction Y, or an obtuse or acute angle is provided between the first direction X and the second direction Y. Alternatively, in order to ensure the same stretching and display effect when stretched in different directions, four connection areas 102 are connected to each island 101, the four connection areas 102 are uniformly distributed at the periphery of the connected island 101, and the four is lands 101 are uniformly distributed at the periphery of each penetration 103, each island 101 being designed in a quadrangular symmetric form, optionally a tetragon.

By adopting the arrangement structure, the shape of the penetrating part 103 is changed when the substrate body 100 is stretched and bent by utilizing the flexibility characteristic of the substrate body 100, so that a certain stretching rate is realized through stretching and shape change of the penetrating part 103, and a stretchable display device is formed.

According to the display substrate in the embodiment of the present disclosure, each island 101 is formed as a pixel unit arrangement area, that is, the pixel units are arranged on the island 101, and in order to ensure the full utilization of the pixel unit arrangement area on each island 101, pixel groups comprising two pixel units are sequentially arranged on the island 101 to form an n×m arrangement form and cover the whole island 101. Therefore, the pixel unit arrangement area of the island portion 101 can be fully utilized, and the purposes of improving the resolution ratio and the display effect are achieved.

Alternatively, the pixel unit arrangement area of the island 101 is quadrangular, and at least three sub-pixel combinations within each pixel unit included in the pixel group are arranged to form a quadrangular pixel unit area to match the pixel unit arrangement area of the island 101.

Figure 2:
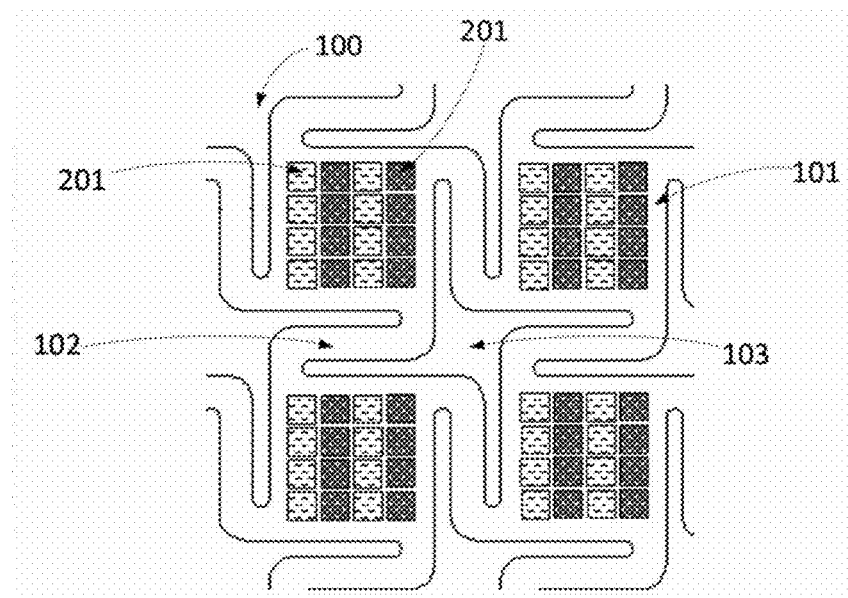
FIG. 2 is a schematic diagram showing an arrangement structure of pixel units on a display substrate according to an embodiment of the present disclosure.
Figure 3:
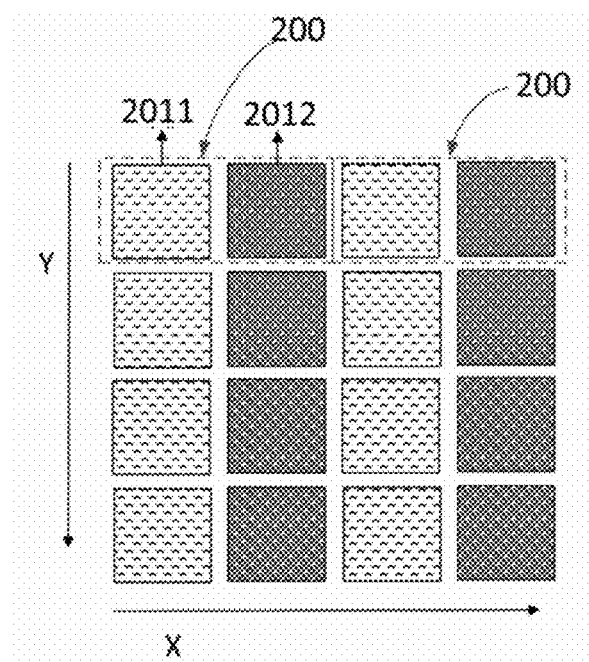
FIG. 3 is a schematic diagram of a portion of the structure of the pixel unit of FIG. 2.

Specifically, referring to FIGS. 2 and 3, the display substrate according to an embodiment of the present disclosure includes a plurality of island portions 101 spaced apart from each other, a plurality of connection areas 102 connecting the plurality of island portions 101, and penetration portions 103 penetrating the substrate body 100 among the plurality of connection areas 102, and at least a portion of each edge of the island portions 101 is connected to the connection areas 102.

A plurality of pixel groups 200 are respectively arranged on the island portions 101 of the substrate body 100; each pixel group 200 comprises two pixel units 201 arranged adjacently along a first direction X, wherein the arrangement modes of sub-pixels in the two pixel units 201 are different, and a plurality of pixel groups 200 form an n×m arrangement mode on the island 101 and cover the whole island 101; the first direction is a direction parallel to one edge of the island;

N represents the number of pixel groups 200 in the row direction, m represents the number of pixel groups 200 in the column direction, and n and m are integers greater than or equal to 1, respectively.

Alternatively, on the island 101, the row direction in which the plurality of pixel groups 200 are arranged is parallel to the first direction X, and the column direction in which the plurality of pixel groups 200 are arranged is parallel to the second direction Y perpendicular to the first direction X.

In the disclosed embodiment, optionally, the sub-pixel combination arrangement within each pixel unit 201 is formed as a quadrangular pixel unit area.

In addition, the two pixel units 201 comprise a first pixel unit 2011 and a second pixel unit 2012, wherein the second pixel unit 2012 is arranged along a first direction X relative to the first pixel unit 2011; on each island 101, pixel groups 200 composed of a first pixel unit 2011 and a second pixel unit 2012 are sequentially arranged along a first direction X and a second direction Y to form a display unit area which is quadrangular and comprises a plurality of pixel groups which forms a n×m arrangement, and the pixel unit arrangement area of the island 101 is quadrangular, and the plurality of pixel groups are sequentially arranged to cover the pixel unit arrangement area of the whole island 101; therefore, the pixel unit area formed by a plurality of pixel groups can adapt to the pixel unit arrangement area of the island portion 101 in a quadrilateral shape, so that the pixel unit arrangement area of the island portion 101 is fully utilized.

In the embodiment of the present disclosure, in each pixel group 200, by making the arrangement mode of the sub-pixels in the first pixel unit 2011 different from the arrangement mode of the sub-pixels in the second pixel unit 2012, the purpose of improving the display effect of the pixel unit area formed by a plurality of pixel groups can be achieved.

Alternatively, the arrangement of the sub-pixels in the mirror image of the first pixel unit 2011 mirrored along a straight line parallel to the first direction is the same as the arrangement of the sub-pixels in the second pixel unit 2012.

Through the implementation structure, the arrangement of the sub-pixels of the first pixel unit 2011 and the sub-pixels of the second pixel unit 2012 in the pixel group 200 is regular, and the process of the pixel unit can be simplified while the display effect is improved.

Alternatively, in the disclosed embodiment, the sub-pixels within the first pixel unit 2011 and the second pixel unit 2012 are both arranged to form a pixel unit area of a quadrilateral.

Figure 4:
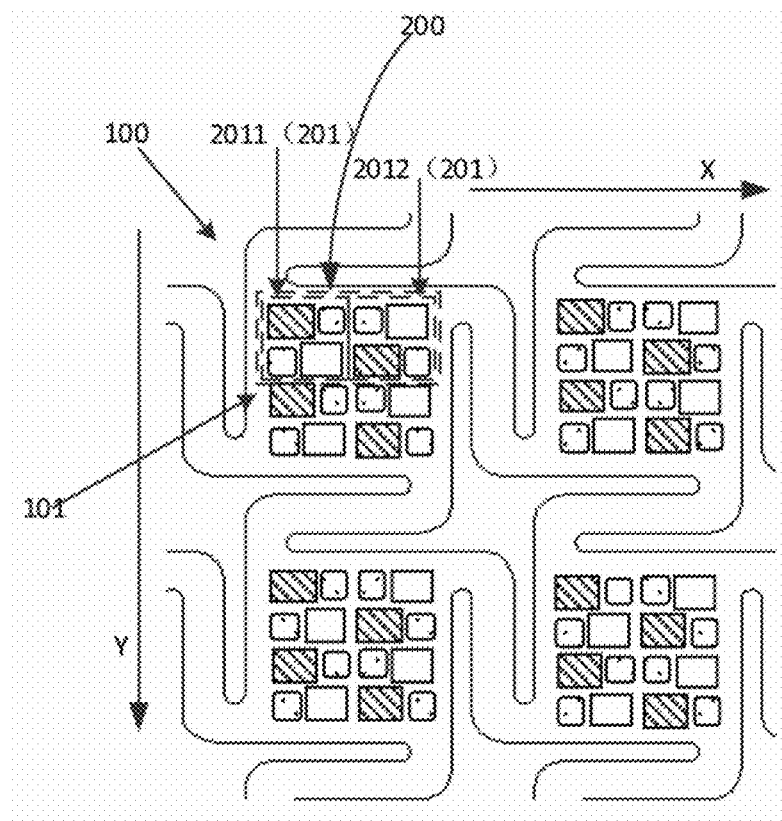
FIG. 4 is a schematic structural view of an embodiment of a display substrate according to an embodiment of the present disclosure.
Figure 5:
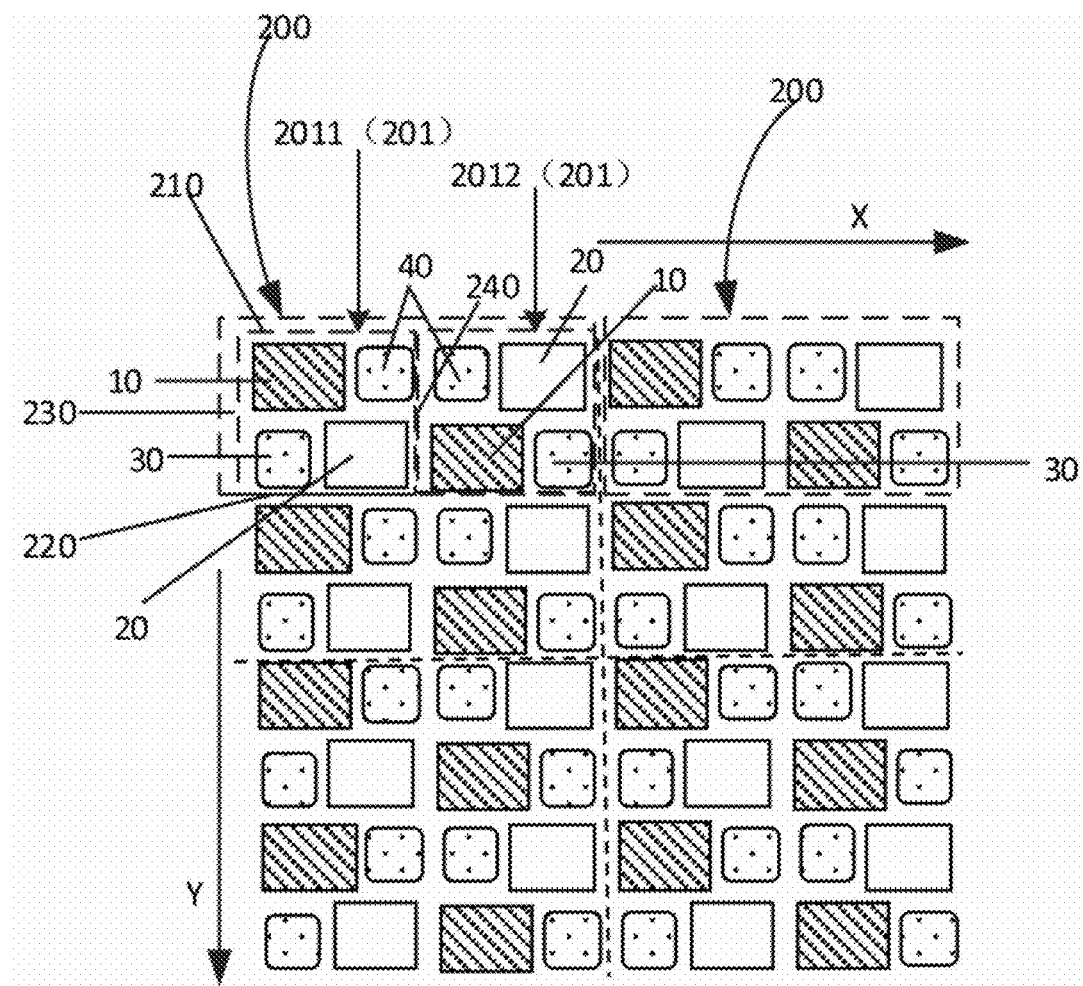
FIG. 5 is a schematic view showing an arrangement structure of the pixel unit in FIG. 4.

FIG. 4 is a schematic structural view of an embodiment one of the display substrates according to the embodiment of the present disclosure, and FIG. 5 is a schematic partial structural view of a pixel unit in the embodiment one.

Referring to FIGS. 4 and 5, in the display substrate according to one embodiment, a plurality of pixel groups 200 are respectively provided on the island portions 101 of the substrate body 100;

Each pixel group 200 comprises two pixel units 201 which are adjacently arranged along a first direction X, the arrangement modes of the sub-pixels in the two pixel units 201 are different, and the sub-pixels in each pixel unit 201 are combined and arranged to form a quadrilateral pixel unit area. In the present embodiment, the sub-pixel combination arrangement within each pixel unit 201 is formed as a pixel unit area of a quadrilateral, but is not limited to being able to be a quadrilateral only.

In the disclosed embodiment, each island 101 is formed as a quadrilateral, a plurality of pixel groups 200 are sequentially arranged in a first direction X and/or a second direction Y within a pixel unit arrangement area of the quadrilateral enclosed by the island 101 to form a plurality of pixel groups 200 in an n×m arrangement form, and are arranged according to the pixel unit arrangement area of the quadrilateral enclosed by the island 101, that is, to cover the whole island 101 According to the invention, the outline of the outer edge of the pixel unit area formed by combining a plurality of pixel groups 200 arranged on the island portion 101 is formed into a quadrilateral, the area and the size are matched with the area and the size of the island portion 101, the full utilization of the quadrangular pixel unit arrangement area defined on the island portion 101 is ensured, and the pixel unit can obtain the maximum area distribution on the quadrangular pixel unit arrangement area.

In the embodiment one of FIG. 4, which is illustrated as an example where the area of the pixel unit arrangement area of the island 101 is adapted to four pixel units 201 (i.e., two pixel groups 200), it should be noted that, when embodied on a display device, the island 101 is not limited to an area that can only be formed to be adapted to the size of the four pixel units 201.

In the display substrate in the embodiment of the present disclosure, optionally, the sub-pixels in each pixel unit 201 are arranged to form a quadrangular pixel unit area, and the areas of the pixel unit areas formed by the arrangement of the sub-pixels in the two pixel units 201 are the same, that is, the areas of the pixel unit areas formed by the arrangement of the sub-pixels in the first pixel unit 2011 and the second pixel unit 2012 are the same.

It should be noted that in the disclosed embodiment, at least three sub-pixels are included in the pixel unit 201, the at least three sub-pixels are arranged according to a certain regular arrangement, and the area covered by the combination of the at least three sub-pixels is formed as a pixel unit area. Specifically, as shown in FIGS. 4 and 5, the outer edges of the sub-pixels in the pixel unit 201 are connected to form an edge contour of the pixel unit area. That is, at least one edge of each sub-pixel within the pixel unit 201 is formed as part of the edge contour of the pixel unit area.

Alternatively, in Embodiment 1 of the display substrate described in the embodiment of the present disclosure, as shown in FIGS. 4 and 5, the first pixel unit 2011 and the second pixel unit 2012 include four sub-pixels, respectively, wherein at least three of the four sub-pixels are sub-pixels of different colors, respectively.

Specifically, in the first pixel unit 2011, the first sub-pixel 10 and the second sub-pixel 20 respectively cover two ends of a first diagonal of a pixel unit area where the first pixel unit 2011 is located, and the third sub-pixel 30 and the fourth sub-pixel 40 respectively cover two ends of a second diagonal of the pixel unit area.

In this embodiment, the first sub-pixel 10, the second sub-pixel 20, and the third sub-pixel 30 are sub-pixels of different colors, respectively, while the third sub-pixel 30 and the fourth sub-pixel 40 are the sub-pixels of the same colors, and the area of the third sub-pixel 30 is the same as the area of the fourth sub-pixel 40, and the area of the first sub-pixel 10 is the same as the area of the second sub-pixel 20.

For example, the first sub-pixel 10 corresponds to a sub-pixel of a first color, the second sub-pixel 20 corresponds to a sub-pixel of a second color, and the third sub-pixel 30 and the fourth sub-pixel 40 correspond to sub-pixels of a third color, respectively.

It should be noted that, since the sub-pixel combination arrangement within each pixel unit 201 is formed as a quadrangular pixel unit area, for the quadrangular pixel unit area, four opposite edges are included, in which connection positions of adjacent two edges are formed as a vertex angle. It will be understood that the connecting line passing through the center of the quadrangular pixel unit area and connecting the opposite top corners is formed as a diagonal line. Specifically, there is included a first diagonal connecting the upper left corner and the lower right corner of the pixel unit area of the quadrilateral and a second diagonal connecting the upper right corner and the lower left corner of the pixel unit area of the quadrilateral.

In the first pixel unit 2011 of embodiment 1, a sub-pixel of a first color and a sub-pixel of a second color are respectively located at a first end and a second end opposite to a first diagonal of the pixel unit area, and two sub-pixels of a third color are respectively located at a third end and a fourth end opposite to a second diagonal of the pixel unit area.

In addition, with reference to FIGS. 4 and 5, in Embodiment 1, the arrangement of each sub-pixel in the mirror image of the first pixel unit 2011 after mirroring along a straight line parallel to the first direction X is the same as the arrangement of each sub-pixel in the second pixel unit 2012.

Based on the corresponding relationship between the arrangement of each sub-pixel in the mirror image of the first pixel unit 2011 mirrored with respect to the first direction X and the arrangement of each sub-pixel in the second pixel unit 2012, with the above-mentioned definitions of the first diagonal and the second diagonal, in the second pixel unit 2012, two sub-pixels of the third color are respectively located at two opposite positions opposite to the first diagonal. The sub-pixel of the first color and the sub-pixel of the second color are respectively located at two ends opposite to the second diagonal.

In addition, in the first pixel unit 2011 and the second pixel unit 2012, each of the four sub-pixels is a quadrilateral.

By adopting the implementation structure, in the first pixel unit 2011 of the two pixel units 201, the sub-pixel of the first color and the sub-pixel of the second color are respectively located at two ends of the first diagonal line of the pixel unit area; in the second pixel unit 2012 of the two pixel units 201, a sub-pixel of a first color and a sub-pixel of a second color are respectively positioned at two opposite ends of a second diagonal line of the pixel unit area;

The first diagonal line is a diagonal line connecting the upper left corner and the lower right corner of the pixel unit area of the quadrilateral, and the second diagonal line is a diagonal line connecting the upper right corner and the lower left corner of the pixel unit area of the quadrilateral.

Based on the first pixel unit 2011 and the second pixel unit 2012 of the implementation structure, the two pixel units also respectively comprise two sub-pixels of a third color;

In the first pixel unit 2011, two sub-pixels of a third color are respectively positioned at two opposite ends of a second diagonal of a pixel unit area;

In the second pixel unit 2012, the two sub-pixels of the third color are respectively located at two ends of the first diagonal of the pixel unit area.

Further, in the disclosed embodiment, in the first pixel unit 2011, optionally, the sub-pixel of the first color (the first sub-pixel 10) and the sub-pixel of the first third color (the fourth sub-pixel 40) (disposed at the upper right corner of the pixel unit area) each include an edge parallel to the first direction X away from the sub-pixel of the second color and the sub-pixel of the second third color, and the edges are combined to form a first edge 210 of the pixel unit area; the sub-pixel of the second third color (third sub-pixel 30) and the sub-pixel of the second color (second sub-pixel 20) also each comprise an edge parallel to the first direction X, which edge is remote from the sub-pixel of the first color and the sub-pixel of the first third color, and which edge is combined to form a second edge 220 of the pixel unit area.

Further, the sub-pixels of the first color and the sub-pixels of the second third color respectively comprise edges parallel to the second direction Y, the edges are far away from the sub-pixels of the second color and the sub-pixels of the first third color, and the edges are combined to form a third edge 230 of the pixel unit area; the sub-pixels of the first third color and the sub-pixels of the second color each comprise an edge parallel to the second direction Y, the edge being remote from the sub-pixels of the first color and the sub-pixels of the second third color, and the edge being combined to form a fourth edge 240 of the pixel unit area.

Similarly, in the second pixel unit 2012, the sub-pixel of the first third color, the sub-pixel of the second color, the sub-pixel of the second third color and the sub-pixel of the first color are respectively provided at the upper left corner position, the upper right corner position, the lower right corner position and the lower left corner position of the quadrilateral.

Moreover, the sub-pixels of the first third color and the sub-pixels of the second color respectively comprise edges parallel to the first direction X, the edges are far away from the sub-pixels of the second third color and the sub-pixels of the first color, and the edges are combined to form a first edge 210 of the pixel unit area; the sub-pixels of the first color and the sub-pixels of the second third color each comprise an edge parallel to the first direction X, which edge is remote from the sub-pixels of the first third color and the sub-pixels of the second color, and which edges combine to form a second edge 220 of the pixel unit area.

Further, the sub-pixel of the first third color and the sub-pixel of the first color respectively comprise an edge parallel to the second direction Y, the edge is far away from the sub-pixel of the second color and the sub-pixel of the second third color, and the edge is formed as a third edge 230 of the pixel unit area; the sub-pixels of the second color and the sub-pixels of the second third color each comprise an edge parallel to the second direction Y, which edge is remote from the sub-pixels of the first third color and the sub-pixels of the first color, and which edge is formed as a fourth edge 240 of the pixel unit area.

Optionally, the pixel unit areas formed by the first edge 210, the second edge 220, the third edge 230, and the fourth edge 240 are all quadrangular.

Based on the arrangement of the first embodiment, in the first pixel unit 2011 and the second pixel unit 2012, the arrangement modes of the sub-pixels are different.

In addition, in combination with FIGS. 4 and 5, in the first pixel unit 2011 and the second pixel unit 2012 included in each pixel group 200, the sub-pixel of the third color of the first pixel unit 2011 is adjacent to the sub-pixel of the third color of the second pixel unit 2012 in the arrangement described above. Thus, various combinations can be realized among the first color sub-pixel 1, the second color sub-pixel 2 and the third color sub-pixel 30 on the whole display substrate, colorful visual effects can be realized, and in addition, the connection line layout of the sub-pixels can be facilitated.

In addition, as shown in FIGS. 4 and 5, optionally, the sub-pixels of the first color, the sub-pixels of the second color, and the sub-pixels of the two third colors are respectively quadrangular, and optionally, the size of the sub-pixels of the first color is the same as the size of the sub-pixels of the second color, and the size of the sub-pixels of the two third colors is the same. and the sizes of the sub-pixels of the first color and the sub-pixels of the second color are larger than the sizes of the sub-pixels of the two third colors.

Optionally, the size of the sub-pixel of the first color and the sub-pixel of the second color in each direction is between 10 um and 50 um; the size of the sub-pixels of the third color lies between 5 um and 50 um.

In the disclosed embodiment, the first color, the second color, and the third color are one of red, blue, and green, respectively. It should be noted that the colors of the pixel units provided within the pixel units are not limited to being able to include only the colors described above.

In addition, the sub-pixels of the first color, the sub-pixels of the second color and the sub-pixels of the two third colors are not limited to being only quadrilateral, but also triangular, pentagonal, hexagonal, circular, elliptical or other irregular patterns, so long as a plurality of sub-pixels in each pixel unit can be combined and arranged to form a quadrilateral pixel unit area.

Figure 6:
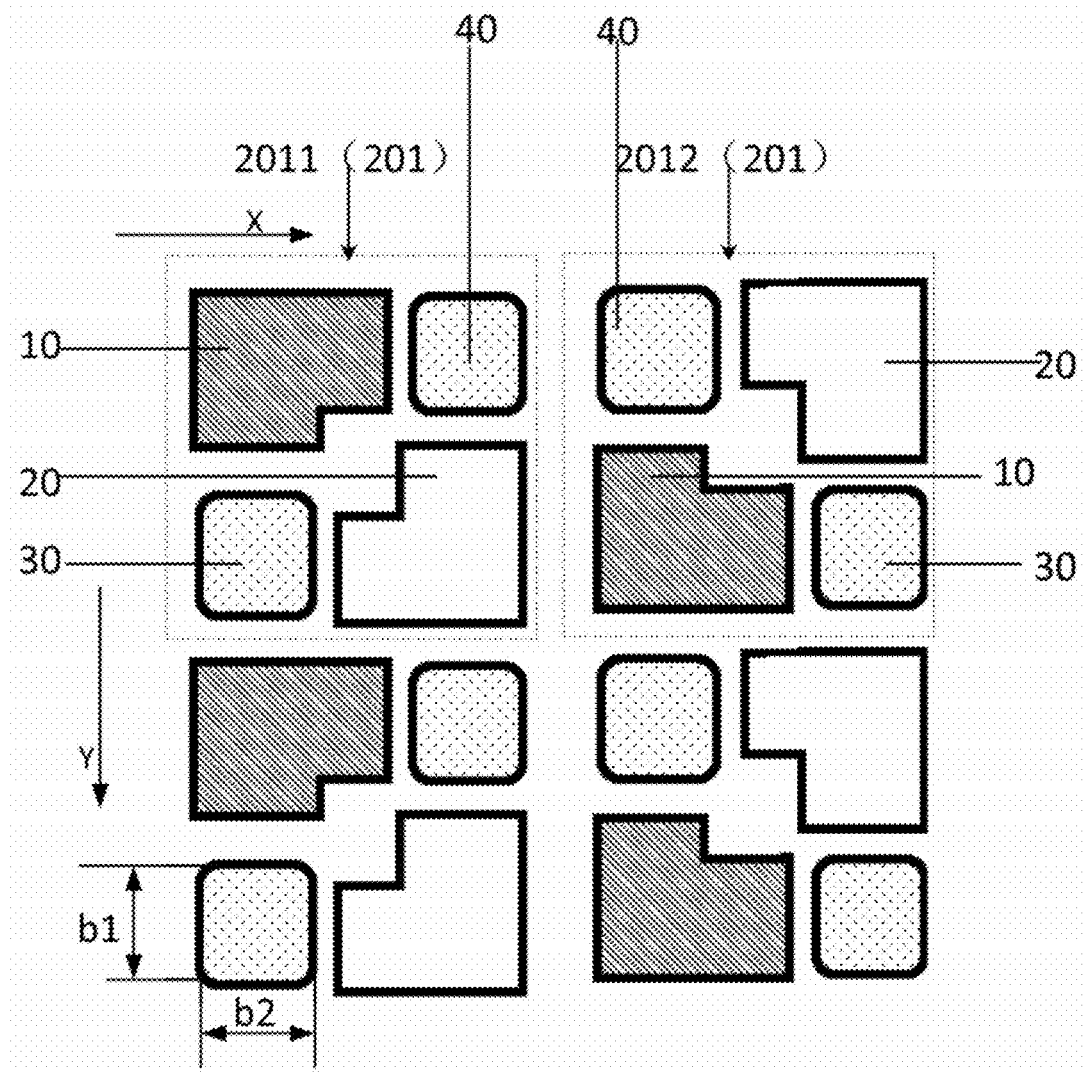
FIG. 6 is a schematic diagram showing an arrangement structure of pixel units according to an embodiment II of the display substrate according to the embodiment of the present disclosure.

In addition, the embodiment of the present disclosure also provides the display substrate of Embodiment II, as shown in FIG. 6, in Embodiment II, the arrangement manner of the sub-pixels in the first pixel unit 2011 and the second pixel unit 2012 is the same as Embodiment I, and will not be described in detail herein.

Also, in Embodiment 2, the arrangement of each sub-pixel in the mirror image of the first pixel unit 2011 after mirroring along a straight line parallel to the first direction X is the same as the arrangement of each sub-pixel in the second pixel unit 2012. However, in the second embodiment, the shape of the molecular pixel in the middle of the first sub-pixel 2011 and the second pixel unit 2012 is different from that in the first embodiment.

Specifically, in the first pixel unit 2011 and the second pixel unit 2012 of Embodiment II, the first sub-pixel 10 and the second sub-pixel 20 are each formed as a concave hexagon, and the third sub-pixel 30 and the fourth sub-pixel 40 are each quadrangular.

In the first pixel unit 2011 and the second pixel unit 2012, the first sub-pixel 10 is a sub-pixel of a first color, the second sub-pixel 20 is a sub-pixel of a second color, and the third sub-pixel 30 and the fourth sub-pixel 40 are sub-pixels of a third color, respectively, as examples, the shapes of the sub-pixels in the first pixel unit 2011 and the second pixel unit 2012 in embodiment two will be described.

Figure 7:
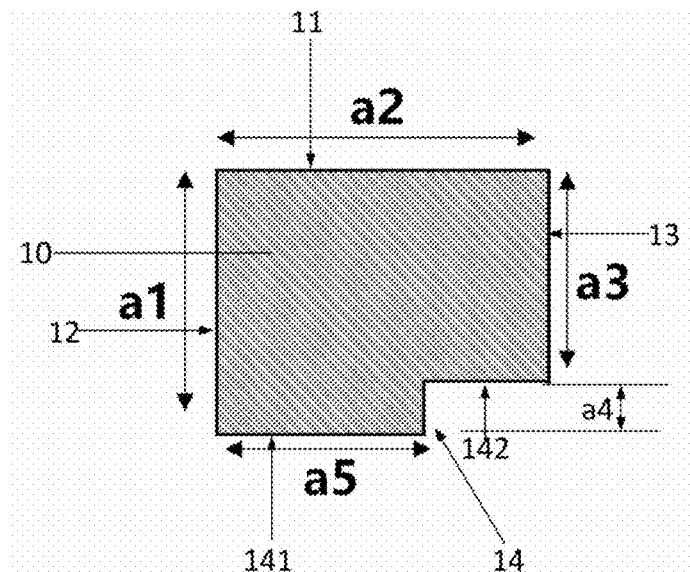
FIG. 7 is a schematic diagram of the structure of the first color sub-pixel of FIG. 6.
Figure 8:
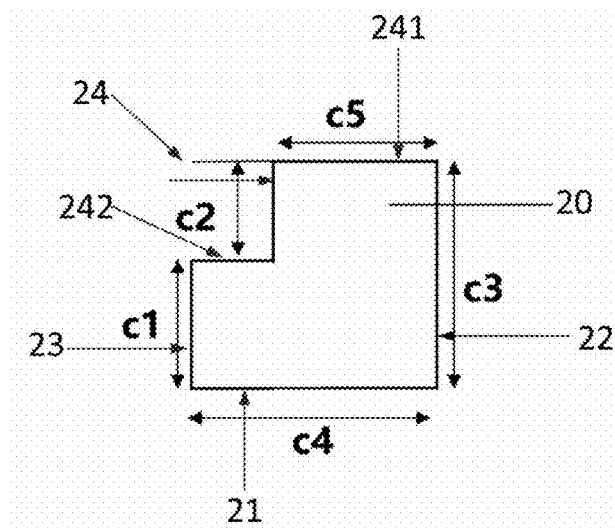
FIG. 8 is a schematic diagram of the structure of the second color sub-pixel of FIG. 6.

Specifically, as shown in FIGS. 6, 7 and 8, in the first pixel unit 2011 and the second pixel unit 2012 of Embodiment II, the sub-pixel 10 of the first color includes:
   A first boundary 11 of a sub-pixel parallel to the first direction X and distant from the second color;
   A second boundary 12 of the sub-pixel 20 parallel to the second direction Y and remote from the second color;
   A third boundary 13 parallel to the second direction Y and close to the sub-pixel 20 of the second color;
   A fourth boundary 14 of the sub-pixel 20 parallel to the first direction X and close to the second color.

Here, the size of the third boundary 13 is smaller than that of the second boundary 12, and the fourth boundary 14 is formed in a stepped shape including a first portion 141 distant from the first boundary 11 and a second portion 142 close to the first boundary 11.

Alternatively, the first portion 141 of the first boundary 11, the second boundary 12, the third boundary 13, the fourth boundary 14 and the second portion 142 of the fourth boundary 14 are all formed as straight line segment boundaries.

The sub-pixel of the second color includes:
   A fifth boundary 21 parallel to the first direction X and remote from the sub-pixels of the first color;
   A sixth boundary 22 parallel to the second direction Y and remote from the sub-pixels of the first color;
   A seventh boundary 23 parallel to the second direction Y and close to the sub-pixels of the first color;
   An eighth boundary 24 of the sub-pixel parallel to the first direction X and close to the first color.

Here, the size of the seventh boundary 23 is smaller than that of the sixth boundary 22, and the eighth boundary 24 is formed in a stepped shape including a third portion 241 remote from the fifth boundary 21 and a fourth portion 242 near the fifth boundary 21.

Alternatively, the third portion 241 of the fifth boundary 21, the sixth boundary 22, the seventh boundary 23, the eighth boundary 24, and the fourth portion 242 of the eighth boundary 24 are all formed as straight line segment boundaries.

The sub-pixels of the first color and the sub-pixels of the second color of the implementation structure are formed in complementary forms at opposite positions so as to effectively improve the utilization rate of the island 101.

As shown in connection with FIGS. 6 and 7, optionally, in sub-pixels of the first color, the size a2 of the first border 11 lies between 15 um and 50 um, optionally 23 um; the size a1 of the second boundary 12 is between 15 um and 50 um, optionally 23 um; the size a3 of the third boundary 13 is between 15 um and 50 um, optionally 20 um; the size a5 of the first part 141 of the fourth boundary 14 is between 15 um and 50 um, optionally 18 um; the vertical distance a4 between the second part 142 and the first part 141 lies between 1 um and 10 um, optionally 3 um.

As shown in FIGS. 6 and 8, in the sub-pixel of the second color, the size c4 of the fifth border 21 lies between 15 um and 50 um, optionally 23 um; the size c3 of the sixth boundary 22 is between 15 um and 50 um, and is optionally 23 um; the size c1 of the seventh boundary 23 is between 10 um and 50 um, optionally 16 um; the size c5 of the third portion 241 of the eighth boundary 24 is between 15 mum and 50 mum, optionally 12 mum; the vertical distance c2 between the third portion 241 and the fourth portion 242 lies between 5 um and 50 um, optionally 7 um.

In addition, in combination with FIG. 6, in the embodiment of the present disclosure, the size b2 of two sub-pixels of the third color in the first pixel unit 2011 and the second pixel unit 2012, which are parallel to the first direction X, is located between 5 mum and 50 mum, optionally 8 mum; the dimension bi parallel to the second direction Y lies between 5 um and 50 um, optionally 8 um.

According to the above, the sub-pixel of the first color and the sub-pixel of the second color each include six boundaries, and each boundary is disposed parallel to the first direction X or the second direction Y, and two of the boundaries are formed in a concave hexagonal structure concave toward the inside of the sub-pixel. It is to be noted that in Embodiment II, the configuration shape of each sub-pixel in the first pixel unit 2011 and the second pixel unit 2012 described above is only an example, and is not limited to being able to be formed only in the configuration shape described above, for example, each sub-pixel may also have a triangular shape, a pentagonal shape, a regular hexagonal shape, a circular shape, an elliptical shape, or other irregular shape.

Figure 9:
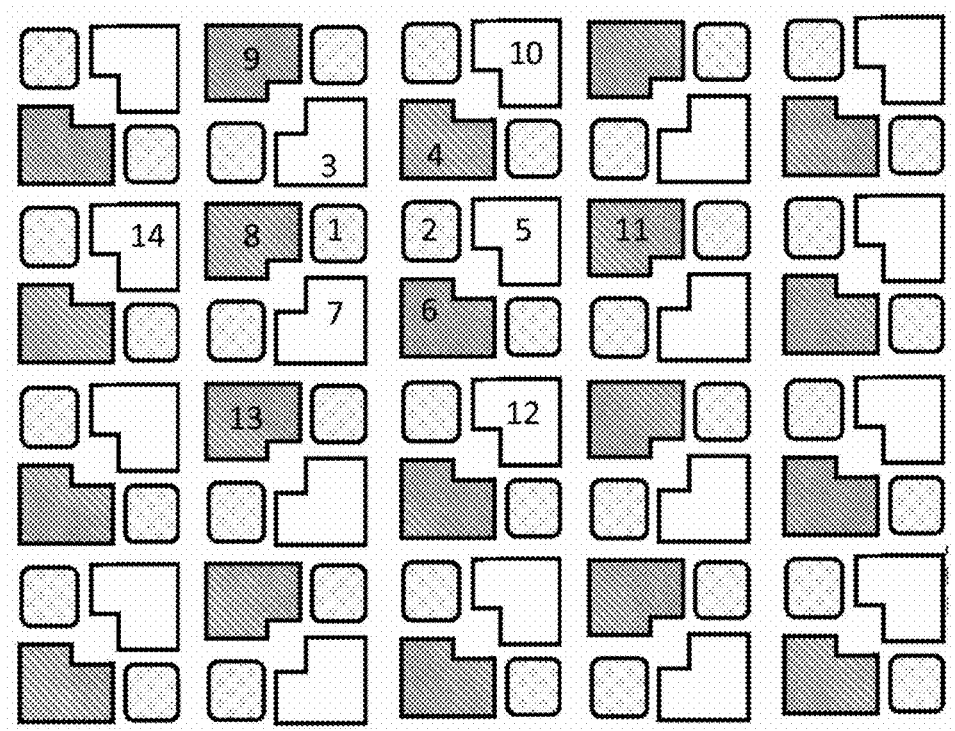
FIG. 9 is a schematic view showing a structure in which a plurality of RGB sub-pixels are combined on the display substrate of FIG. 6.

In addition, with reference to FIG. 4, FIG. 6 and FIG. 9, taking Embodiment II as an example, since the disclosed embodiment, in the first pixel unit 2011 and the second pixel unit 2012 included in each pixel group 200, the third color sub-pixel 3 of the first pixel unit 2011 is adjacent to the third color sub-pixel 3 of the second pixel unit 2012, and various combinations can be realized between sub-pixels of different colors. if the three color sub-pixels respectively correspond to the R, G and B three color sub-pixels, 24 combinations exist between the sub-pixels of each color of the R, G and B and the adjacent pixels of other colors, and the colorful visual effect is further realized.

As shown in FIG. 9, for example, reference numerals 1 to 14 in FIG. 9 denote one sub-pixel, green pixels filled with black dots in the sub-pixel, blue pixels filled with oblique lines, and red pixels unfilled with patterns, respectively; centered on the sub-pixel numbered 1, 24 combinations of R, G and B are formed as follows:

Combination of RGB 1: sub-pixel 1, sub-pixel 3 and sub-pixel 8;
Combination of RGB 2: sub-pixel 1, sub-pixel 3 and sub-pixel 9;
Combination of RGB 3: sub-pixel 1, sub-pixel 3 and sub-pixel 4;
Combination of RGB 4: sub-pixel 1, sub-pixel 4 and sub-pixel 10;
Combination of RGB 5: sub-pixel 1, sub-pixel 4 and sub-pixel 5;
Combination of RGB 6: sub-pixel 1, sub-pixel 5 and sub-pixel 11;
Combination of RGB 7: sub-pixel 1, sub-pixel 5 and sub-pixel 6;
Combination of RGB 8: sub-pixel 1, sub-pixel 6 and sub-pixel 7;
Combination of RGB 9: sub-pixel 1, sub-pixel 6 and sub-pixel 12;
Combination of RGB 10: sub-pixel 1, sub-pixel 7 and sub-pixel 13;
Combination of RGB 11: sub-pixel 1, sub-pixel 7 and sub-pixel 8;
Combination of RGB 12: sub-pixel 1, sub-pixel 8 and sub-pixel 14;

For sub-pixel 2, which is also a green pixel and is adjacent to sub-pixel 1, there may be the following pixel combinations:

Combination of RGB 13: sub-pixel 2, sub-pixel 8 and sub-pixel 14;
Combination of RGB 14: sub-pixel 2, sub-pixel 3 and sub-pixel 8;
Combination of RGB 15: sub-pixel 2, sub-pixel 3 and sub-pixel 9;
Combination of RGB 16: a sub-pixel 2, a sub-pixel 3 and a sub-pixel 4;
Combination of RGB 17: a sub-pixel 2, a sub-pixel 4 and a sub-pixel 10;
Combination of RGB 18: a sub-pixel 2, a sub-pixel 4 and a sub-pixel 5;
Combination of RGB 19: a sub-pixel 2, a sub-pixel 5 and a sub-pixel 11;
Combination of RGB 20: a sub-pixel 2, a sub-pixel 5 and a sub-pixel 6;
Combination of RGB 21: sub-pixel 2, sub-pixel 6 and sub-pixel 12;
Combination of RGB 22: sub-pixel 2, sub-pixel 6 and sub-pixel 7;
Combination of RGB 23: sub-pixel 2, sub-pixel 7 and sub-pixel 13;
Combination of RGB 24: sub-pixel 2, sub-pixel 7 and sub-pixel 8.

Therefore, various combinations can be realized among the sub-pixels with different colors, and colorful visual effects can be realized.

Figure 10:
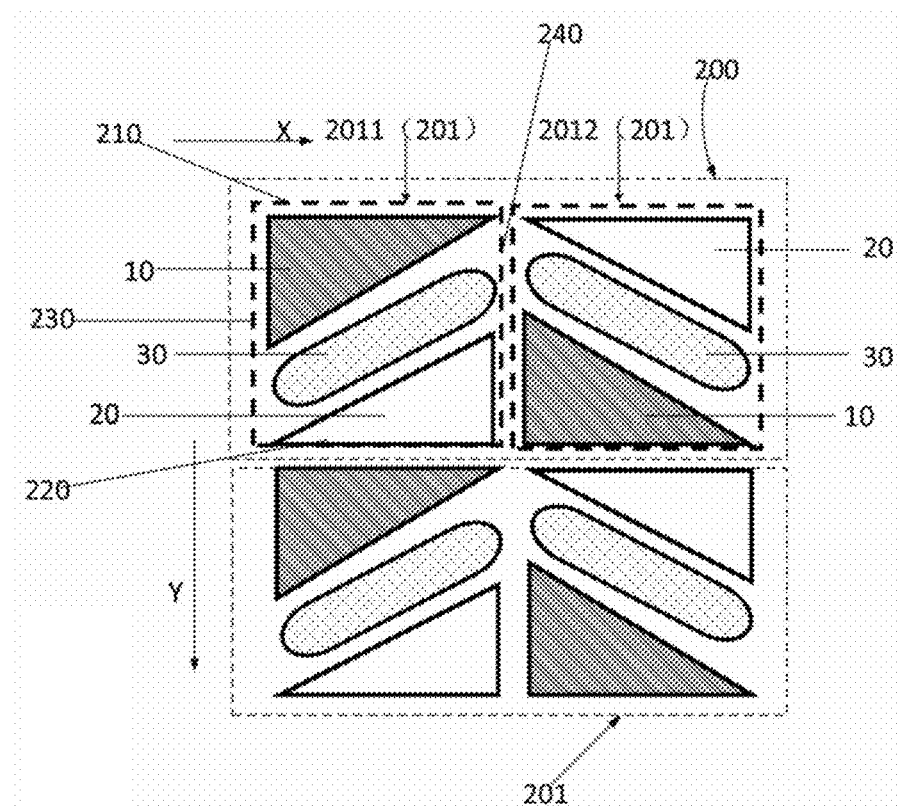
FIG. 10 is a schematic diagram showing an arrangement structure of pixel units according to a third embodiment of the display substrate according to the embodiment of the present disclosure.

FIG. 10 is a schematic view showing the structure of Embodiment III of the display substrate according to the embodiment of the present disclosure, and as shown in FIG. 2, in the display substrate according to Embodiment III, a plurality of pixel groups 200 are respectively provided on the island portion 101 of the substrate body 100 as in the embodiment described above;

Each pixel group 200 comprises two pixel units 201 arranged adjacently along a first direction X, wherein the arrangement structures of the sub-pixels in the two pixel units 201 are different, and the sub-pixel combination arrangement in each pixel unit 201 forms a quadrilateral pixel unit area.

Alternatively, as shown in FIG. 10, in Embodiment 3, the sub-pixels in each pixel unit 201 are arranged to form a pixel unit area of a quadrilateral, and the area of the pixel unit area formed by the sub-pixel arrangement in the two pixel units 201 is the same, that is, the area of the pixel unit area formed by the sub-pixels in the first pixel unit 2011 and the second pixel unit 2012 respectively arranged is the same.

In Embodiment 3, as shown in FIG. 10, the first pixel unit 2011 and the second pixel unit 2012 include three sub-pixels, respectively, and the three sub-pixels are sub-pixels of different colors, respectively.

Specifically, in the first pixel unit 2011, the first sub-pixel 10 and the second sub-pixel 20 respectively cover two ends of a first diagonal line of a pixel unit area where the first pixel unit 2011 is located, and the third sub-pixel 30 is disposed between the first sub-pixel 10 and the second sub-pixel 30 and covers a second diagonal line of the pixel unit area and is disposed along the second diagonal line.

Here, the definition of the first diagonal and the second diagonal in the pixel unit area is as described above, and will not be explained here.

For example, in the first pixel unit 2011, the first sub-pixel 10 corresponds to a sub-pixel of a first color, the second sub-pixel 20 corresponds to a sub-pixel of a second color, and the third sub-pixel 30 corresponds to a sub-pixel of a third color.

In the first pixel unit 2011 of the two pixel units 201, the sub-pixel of the first color and the sub-pixel of the second color are respectively positioned at two opposite ends of the first diagonal of the pixel unit area, and the sub-pixel of the third color is arranged along the second diagonal and covers the second diagonal.

In addition, with reference to FIG. 10, in Embodiment 3, the arrangement of each sub-pixel in the mirror image of the first pixel unit 2011 after mirroring along a straight line parallel to the first direction X is the same as the arrangement of each sub-pixel in the second pixel unit 2012.

Based on the corresponding relationship between the arrangement of each sub-pixel in the mirror image of the first pixel unit 2011 mirrored with respect to the first direction X and the arrangement of each sub-pixel in the second pixel unit 2012, in the second pixel unit 2012, the sub-pixel of the first color and the sub-pixel of the second color are respectively located at two opposite positions of the second diagonal of the pixel unit area according to the above-mentioned definitions with respect to the first diagonal and the second diagonal. The sub-pixels of the third color are disposed along the first diagonal and overlie the first diagonal.

In embodiment three, in both of the pixel units, the sub-pixel of the first color and the sub-pixel of the second color are triangular, and the sub-pixel of the first color comprises an edge parallel to the first direction X and arranged along the first edge 210 of the pixel unit area, and the sub-pixel 20 of the second color also comprises an edge parallel to the first direction X. the edge is arranged along a second edge 220 of the pixel unit area; the first edge 210 is opposite to the second edge 220;

In addition, the two pixel units each comprise a sub-pixel 30 of a third color;

The sub-pixels of the third color extend in a preset direction inclined with respect to the first direction X and are located between the sub-pixels of the first color and the sub-pixels of the second color.

Optionally, as shown in FIG. 10, in a first pixel unit 2011, a sub-pixel of a first color is arranged at the upper left corner position (one pair of ends of a first diagonal line) of a pixel unit area and comprises an edge parallel to a first direction X and an edge parallel to a second direction Y; here, the edge of the sub-pixel of the first color parallel to the first direction X is formed as the first edge 210 of the pixel unit area, and the edge of the sub-pixel of the first color parallel to the second direction Y is formed as part of the third edge 230 of the pixel unit area. The sub-pixel of the second color is arranged at the lower right corner position of the pixel unit area (the other pair of ends of the first diagonal), and comprises an edge parallel to the first direction X and an edge parallel to the second direction Y; here, the edge parallel to the first direction X of the sub-pixel of the second color is formed as the second edge 220 of the pixel unit area, and the edge parallel to the second direction Y is formed as part of the fourth edge 240 of the pixel unit area.

Further, the sub-pixels of the first color and the sub-pixels of the second color respectively comprise edges inclined relative to the first direction X and the second direction Y, alternatively, the edges inclined relative to the first direction X and the second direction Y of the sub-pixels of the first color and the sub-pixels of the second color are parallel to each other, and a sub-pixel of a third color extending in a preset direction is arranged between the two edges; alternatively, the length extension direction of the sub-pixels of the third color is parallel to the edges of the sub-pixels of the first color and the sub-pixels of the second color that are inclined with respect to the first direction X and the second direction Y.

In the pixel unit implementation structure described above, optionally, the number of the sub-pixels 30 of the third color is one and formed in an oblong shape, otherwise referred to as an oblong shape. Further, one end of the sub-pixel of the third color extends to an extended position of an edge of the sub-pixel of the first color parallel to the second direction Y, and is combined with the edge of the sub-pixel of the first color parallel to the second direction Y to form a third edge 230 of the pixel unit area; the other end of the sub-pixel of the third color extends to an extended position of an edge of the sub-pixel of the second color parallel to the second direction Y, and is combined with the edge of the sub-pixel of the second color parallel to the second direction Y to form a fourth edge 240 of the pixel unit area.

By the same reasoning, in the second pixel unit 2012, the layout principle of the sub-pixel of the first color, the sub-pixel of the second color and the sub-pixel of the third color is the same as that of the first pixel unit 2012, except that the sub-pixel of the first color is arranged at the lower left corner position (one pair of end positions of the second diagonal) and the upper right corner position (the other pair of end positions of the second diagonal) of the pixel unit area of the quadrilateral; the pixel structure of the second pixel unit 2012 should be understood in conjunction with FIG. 10 and the above detailed description, and will not be described in detail herein.

Figure 11:
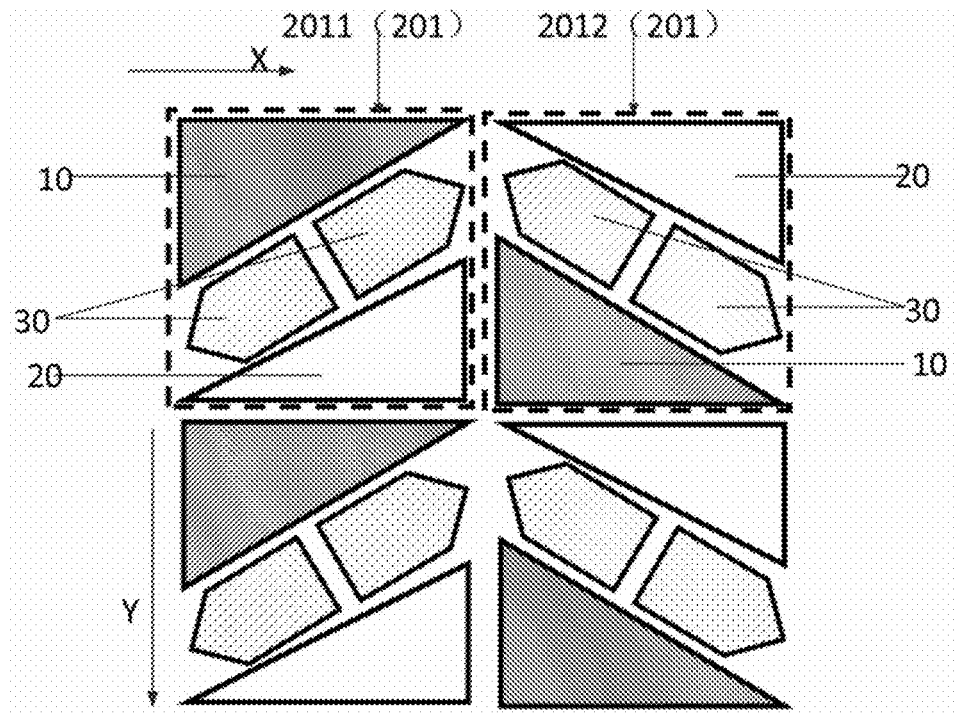
FIG. 11 is a third embodiment of a display substrate according to the embodiment of the present disclosure, and a second schematic diagram of an arrangement structure of pixel units.
Figure 12:
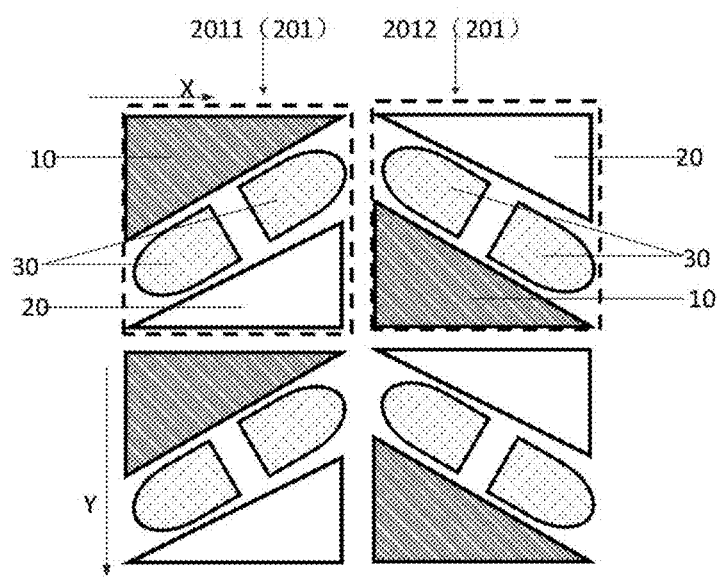
FIG. 12 is a third embodiment of a display substrate according to the embodiment of the present disclosure, and a third schematic diagram of an arrangement structure of pixel units.

It should be noted that, in Embodiment 3, the sub-pixel of the third color disposed between the sub-pixel of the first color and the sub-pixel 20 of the second color is not limited to the structure shown in FIG. 10 only, and by way of example, the first sub-pixel 10 corresponds to the sub-pixel of the first color and the second sub-pixel 20 corresponds to the sub-pixel of the second color. The third sub-pixel 30 corresponds to a sub-pixel of a third color as an example, as shown in the figure As shown in FIGS. 11 and 12, when the sub-pixels 10 of the first color and the sub-pixels 20 of the second color are arranged according to the manner shown in FIG. 10, the number of the sub-pixels 30 of the third color may be at least two (FIGS. 11 and 12 are only two examples), and are sequentially arranged in a predetermined direction inclined with respect to the first direction X and the second direction Y. The combination of pixels forms an elongated third color.

Specifically, as shown in FIGS. 11 and 12, the third sub-pixel 30 disposed between the sub-pixel of the first color and the sub-pixel 20 of the second color includes two sub-pixel units of the third color, each of which is semi-elliptical or pentagonal. Specifically, when the sub-pixel units are semi-elliptical, as shown in FIG. 12, the shapes of the two sub-pixel units are respectively formed as part of an elliptical shape, one ends of the two sub-pixel units which are far away from each other are arc ends, one ends which are close to each other are straight ends, and the two sub-pixel units can be combined to form an elliptical shape. When the sub-pixel unit is a pentagon, as shown in FIG. 11, one ends of the two sub-pixel units, which are far away from each other, are formed as triangular ends, one ends, which are close to each other, are linear ends, and two opposite edges are connected to the triangular ends and the linear ends, thereby forming the sub-pixel units which are respectively pentagon-shaped.

Figure 13:
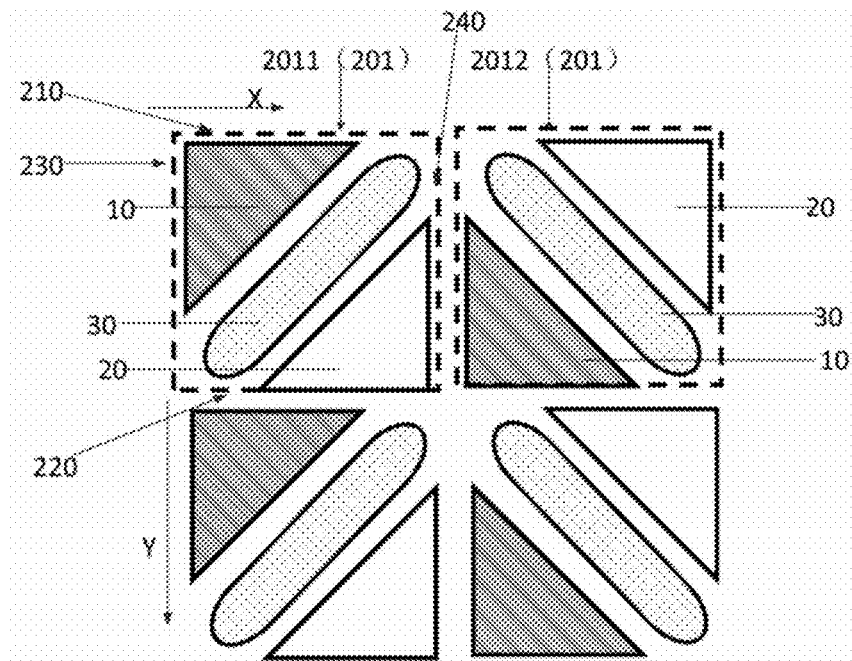
FIG. 13 is a schematic view showing an arrangement structure of pixel units according to an embodiment four of the display substrate according to the embodiment of the present disclosure.

Furthermore, in the third embodiment of the display substrate in the embodiment of the present disclosure, in the first pixel unit 2011 and the second pixel unit 2012, the sizes of the sub-pixels of the first color and the sub-pixels 20 of the second color are not limited to only being capable of being shown in FIG. 10, such as another pixel structure of FIG. 13, in the first pixel unit 2011, the sub-pixel of the first color and the sub-pixel of the second color are triangular, the sub-pixel of the third color is arranged between the sub-pixel of the first color and the sub-pixel of the second color, and the edge, parallel to the first direction X, of the sub-pixel of the first color is combined with the extending edge of the sub-pixel of the third color to form a first edge 210 of the pixel unit area; an edge of the sub-pixel of the first color parallel to the second direction Y is combined with an extended edge of the sub-pixel of the third color to form a third edge 230 of the pixel unit area; an edge of the sub-pixel of the second color parallel to the first direction X is combined with an extended edge of the sub-pixel of the third color to form a second edge 220 of the pixel unit area; the edge of the sub-pixel of the second color parallel to the second direction Y is combined with the extended edge of the sub-pixel of the third color to form a fourth edge 240 of the pixel unit area.

Similarly, in the second pixel unit 2012, the same as the first pixel unit 2011, a sub-pixel of a first color and a sub-pixel of a second color are respectively combined with a sub-pixel of a third color to form each edge of a pixel unit area, and the specific embodiment is the same as the first pixel unit 2011 and will not be described in detail herein.

Further, it should be noted that in the pixel structure shown in FIG. 13, the sub-pixels of the third color, which are disposed between the sub-pixels of the first color and the sub-pixels of the second color, may be one or at least two in a specific number, each formed to extend in a predetermined direction.

Alternatively, in the first pixel unit 2011 and the second pixel unit 2012, the area of the first sub-pixel 10 is equal to the area of the second sub-pixel 20.

In addition, according to each embodiment of the display substrate in the embodiment of the present disclosure, the sub-pixels corresponding to the same color in the two pixel units are respectively distributed in different directions of the pixel unit area.

Figure 14:
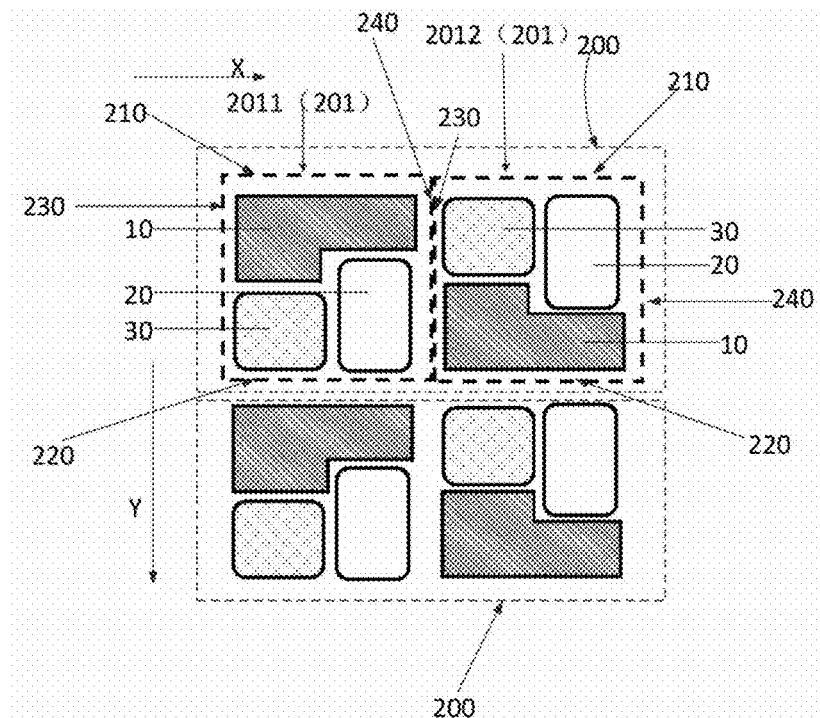
FIG. 14 is a schematic view showing an arrangement structure of pixel units according to an embodiment five of the display substrate according to the embodiment of the present disclosure.

Embodiment No. 4 of the display substrate in the embodiment of the present disclosure, as shown in FIG. 14, is the same as the above-mentioned embodiments No. 1 to Embodiment No. 3, the sub-pixels in each pixel unit 201 are arranged to form a quadrangular pixel unit area, and the area of the pixel unit area formed by the sub-pixel arrangement in the two pixel units 201 is the same. That is, the areas of the pixel unit areas formed by arranging the sub-pixels in the first pixel unit 2011 and the second pixel unit 2012, respectively, are the same.

In embodiment four, as shown in FIG. 14, the first pixel unit 2011 and the second pixel unit 2012 respectively comprise three sub-pixels, and the three sub-pixels are sub-pixels with different colors respectively;

Specifically, in the first pixel unit 2011, a first sub-pixel 10 of the three sub-pixels covers a first opposite terminal position of a first diagonal line and a second opposite terminal position of a second diagonal line of the pixel unit area where the first pixel unit 2011 is located, a second sub-pixel 20 covers a second opposite terminal position of the first diagonal line of the pixel unit area, and a third sub-pixel 30 covers a second opposite terminal position of the second diagonal line.

Here, the definition of the first diagonal and the second diagonal in the pixel unit area is as described above, and will not be explained here.

For example, in the first pixel unit 2011, the first sub-pixel 10 corresponds to a sub-pixel of a first color, the second sub-pixel 20 corresponds to a sub-pixel of a second color, and the third sub-pixel 30 corresponds to a sub-pixel of a third color.

With the above arrangement, in the first pixel unit 2011 of the two pixel units 201, the first end of the first diagonal line and the second end of the second diagonal line of the pixel unit area where the first pixel unit 2011 is located are covered by the sub-pixels of the first color, the second sub-pixel 20 covers the second end of the first diagonal line of the pixel unit area, and the third sub-pixel 30 covers the second pair The second end of the corner line, and since the first diagonal is the diagonal connecting the upper left corner and the lower right corner of the pixel unit area of the quadrilateral, and the second diagonal is the diagonal connecting the upper right corner and the lower left corner of the pixel unit area of the quadrilateral, the sub-pixel of the first color, the sub-pixel of the second color and the sub-pixel of the third color sequentially cover the upper position of the pixel unit area; lower right position and lower left position.

In addition, with reference to FIG. 14, in Embodiment IV, the arrangement of each sub-pixel of the mirror image of the first pixel unit 2011 along a straight line mirror image parallel to the first direction X is the same as the arrangement of each sub-pixel of the second pixel unit 2012.

Based on the corresponding relationship between the arrangement of each sub-pixel in the mirror image of the first pixel unit 2011 mirrored with respect to the first direction X and the arrangement of each sub-pixel in the second pixel unit 2012, in the second pixel unit 2012 of the two pixel units, the sub-pixel of the first color is defined above with respect to the first diagonal and the second diagonal. The sub-pixels of the second color and the sub-pixels of the third color are sequentially positioned at the lower position, the upper right position and the upper left position of the pixel unit area.

Based on the above-described implementation structure, in the first pixel unit 2011 and the second pixel unit 2012, the distribution orientations of the sub-pixels corresponding to the same color are made different.

Specifically, as shown in FIG. 14, in a first pixel unit 2011 of two pixel units, an edge of a sub-pixel of a first color parallel to a first direction X is formed as a first edge 210 of a pixel unit area, and a sub-pixel of a second color and a sub-pixel of a third color are disposed on a side of the sub-pixel of the first color remote from the first edge 210 and are single from the first pixel The direction from the unit 2011 to the second pixel unit 2012 (the direction from left to right in the present embodiment), the sub-pixel of the third color and the sub-pixel of the second color are sequentially arranged, and the edge of the sub-pixel of the second color parallel to the first direction X and the edge of the sub-pixel of the third color parallel to the first direction X are combined to form a second edge 220 of the pixel unit area;

In the second pixel unit 2012 of the two pixel units, the edge of the sub-pixel of the first color parallel to the first direction X is formed as the second edge 220 of the pixel unit area, and the sub-pixel of the third color and the sub-pixel of the second color are arranged on the side, far away from the second edge 220, of the sub-pixel of the first color and in the direction from the first pixel unit 2011 to the second pixel unit 2012. a sub-pixel of a third color and a sub-pixel of a second color are sequentially arranged, and the edge of the sub-pixel of the second color parallel to the first direction X is combined with the edge of the sub-pixel of the third color parallel to the first direction X to form a first edge 210 of a pixel unit area;

The first edge 210 is opposite to the second edge 220, the first edge 210 of the pixel unit area of the first pixel unit 2011 is located on the same straight line as the first edge 210 of the pixel unit area of the second pixel unit 2012, and the second edge 220 of the pixel unit area of the first pixel unit 2011 is located on the same straight line as the second edge 220 of the pixel unit area of the second pixel unit 2012.

Alternatively, the area of the sub-pixels of the first color is larger than the area of the sub-pixels of the second color and the area of the sub-pixels of the third color.

In addition, in the two pixel units of embodiment four, as shown in FIG. 14, in the second direction Y perpendicular to the first direction X, the size of the sub-pixel of the third color is smaller than the size of the sub-pixel of the second color;

The sub-pixels of the first color are close to the edges of the sub-pixels of the second color and the sub-pixels of the third color and are arranged according to the edges of the sub-pixels of the second color and the sub-pixels of the third color.

Specifically, in the first pixel unit 2011 and the second pixel unit 2012, the sub-pixel 20 of the second color and the sub-pixel 30 of the third color are both quadrangular, and the sub-pixel 10 of the first color is a concave hexagon. Here, the specific shape of the sub-pixel of the concave hexagon, that is, as shown with reference to FIG. 14, includes six boundaries, each of which is disposed parallel to the first direction X or the second direction Y, and two of which are formed in a structure concave toward the inside of the sub-pixel.

Wherein, in the first pixel unit 2011, a sub-pixel of a first color is arranged at the upper part of a sub-pixel of a second color and a sub-pixel of a third color and comprises an edge parallel to the first direction X and far away from the sub-pixel of the second color and the sub-pixel of the third color, and the edge is formed as a first edge 210 of a pixel unit area; the sub-pixel of the third color and the sub-pixel of the second color are sequentially arranged below the sub-pixel of the first color from left to right; the sub-pixel of the first color further comprises an edge of the sub-pixel parallel to the second direction Y and far away from the second color, and the edge is combined with the edge of the sub-pixel of the third color parallel to the second direction Y and far away from the second color to form a third edge 230 of the pixel unit area; the sub-pixel of the second color further comprises an edge of the sub-pixel parallel to the second direction Y and remote from the third color, which edge, in combination with an edge of the sub-pixel of the first color parallel to the second direction Y and remote from the third color, is formed as a fourth edge 240 of the pixel unit area.

Further, the edge of the sub-pixel close to the second color of the sub-pixel of the first color and the edge of the sub-pixel of the third color are stepped and comprise two parts located on different straight lines and respectively correspond to the sub-pixel of the second color and the sub-pixel of the third color.

In addition, the edges of the sub-pixels of the second color and the sub-pixels of the third color, which are parallel to the first direction X and distant from the first color, are formed as the second edges 220 of the pixel unit areas.

In the embodiment of the present disclosure, the first edge 210, the second edge 220, the third edge 230, and the fourth edge 240 formed on the basis of the above-described embodiment structure are all straight edges, thereby making the pixel unit area of the first pixel unit 2011 quadrangular.

Similarly, in the second pixel unit 2012, the sub-pixels of the first color are arranged below the sub-pixels of the second color and the sub-pixels of the third color, and the sub-pixels of the third color and the sub-pixels of the second color are sequentially arranged above the sub-pixels of the first color from left to right.

And the sub-pixel of the first color comprises an edge parallel to the first direction X and far away from the sub-pixel of the second color and the sub-pixel of the third color, and the edge is formed as a second edge 220 of the pixel unit area; the sub-pixel of the first color further comprises an edge of the sub-pixel parallel to the second direction Y and far away from the second color, and the edge is combined with the edge of the sub-pixel of the third color parallel to the second direction Y and far away from the second color to form a third edge 230 of the pixel unit area; the sub-pixel of the second color further comprises an edge of the sub-pixel parallel to the second direction Y and remote from the third color, which edge, in combination with an edge of the sub-pixel of the first color parallel to the second direction Y and remote from the third color, is formed as a fourth edge 240 of the pixel unit area.

Further, the edge of the sub-pixel close to the second color of the sub-pixel of the first color and the edge of the sub-pixel of the third color are stepped and comprise two parts located on different straight lines and respectively correspond to the sub-pixel of the second color and the sub-pixel of the third color.

In addition, the edges of the sub-pixels of the second color and the sub-pixels of the third color that are parallel to the first direction X and away from the first color are formed as the first edges 210 of the pixel unit areas.

In the embodiment of the present disclosure, the first edge 210, the second edge 220, the third edge 230, and the fourth edge 240 formed on the basis of the above-described embodiment structure are all straight edges, thus forming a quadrangular pixel unit area of the second pixel unit 2012.

Figure 15:
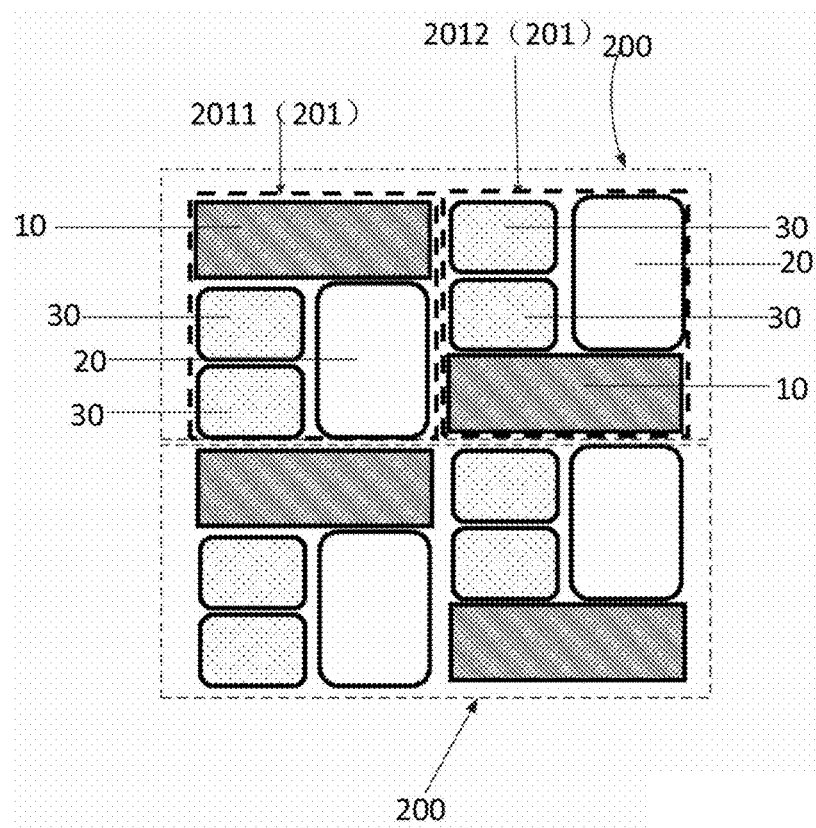
FIG. 15 is a schematic view showing an arrangement structure of pixel units according to an embodiment six of the display substrate according to the embodiment of the present disclosure.

Embodiment 5 of the display substrate in the embodiment of the present disclosure, as shown in FIG. 15, is the same as embodiment 4, the sub-pixels in each pixel unit 201 are arranged to form a pixel unit area of a quadrilateral, and the area of the pixel unit area formed by the sub-pixel arrangement in the two pixel units 201 is the same. That is, the areas of the pixel unit areas formed by arranging the sub-pixels in the first pixel unit 2011 and the second pixel unit 2012, respectively, are the same.

In embodiment five, as shown in FIG. 15, the first pixel unit 2011 and the second pixel unit 2012 respectively include at least three sub-pixels, and three of the sub-pixels are respectively sub-pixels of different colors.

Unlike embodiment four, at least one of the three sub-pixels of different colors consists of at least two sub-pixel units of the same color. Wherein, when at least two sub-pixel units of the same color are regarded as one sub-pixel, the arrangement of the sub-pixels in Embodiment 5 may be regarded as the same as the arrangement of the sub-pixels in Embodiment 4.

Specifically, in the first pixel unit 2011, the first sub-pixel 10 covers a first end of a first diagonal and a second end of a second diagonal of a pixel unit area where the first pixel unit 2011 is located, the second sub-pixel 20 covers a second end of the first diagonal of the pixel unit area, and the third sub-pixel 30 covers a second end of the second diagonal.

In embodiment five, the number of the third sub-pixels 30 is two, each third sub-pixel 20 may correspond to one sub-pixel unit, and the two sub-pixel units are combined to correspond to the sub-pixels formed into the third color.

In addition, in the first pixel unit 2011, the first sub-pixel 10 corresponds to a sub-pixel of a first color, and the second sub-pixel 20 corresponds to a sub-pixel of a second color.

In addition, with reference to FIG. 15, in Embodiment 5, the arrangement of each sub-pixel in the mirror image of the first pixel unit 2011 after mirroring along a straight line parallel to the first direction X is the same as the arrangement of each sub-pixel in the second pixel unit 2012.

By adopting the arrangement mode, in the first pixel unit 2011, the sub-pixels of the first color are arranged on the upper parts of the sub-pixels of the second color and the sub-pixels of the third color, and the sub-pixels of the second color and the sub-pixels of the third color are sequentially arranged below the sub-pixels of the first color from right to left; in the second pixel unit 2012, in the second pixel unit 2012, the sub-pixels of the first color are arranged below the sub-pixels of the second color and the sub-pixels of the third color, and the sub-pixels of the second color and the sub-pixels of the third color are sequentially arranged above the sub-pixels of the first color from right to left.

Unlike Embodiment Four, in the first pixel unit 2011 and the second pixel unit 2012, the first sub-pixel 10, the second sub-pixel 20, and the third sub-pixel 30 are all formed as quadrilaterals.

Optionally, at least one of the sub-pixels of the first color, the sub-pixels of the second color, and the sub-pixels of the third color comprises two pixel portions that are separated. For example, referring to FIG. 15, in the first pixel unit 2011 and the second pixel unit 2012, the sub-pixel 30 of the third color includes two sub-pixel units separated. It should be noted that in particular implementations, the pixel units of the above-described implementation may include at least two sub-pixel units for either sub-pixel.

Thus, by forming the sub-pixel of the first color, the sub-pixel of the second color, and the sub-pixel of the third color as quadrilaterals, it is also possible to make the pixel unit area of the first pixel unit 2011 and the pixel unit area of the second pixel unit 2012 respectively quadrangular.

It should be noted that the implementation structures of the pixel units in the above-described embodiments are illustrative only and are not intended to be limiting. In particular, a person skilled in the art would be able to design pixel units of other variant structures according to the above-mentioned arrangement rules of the pixel units in the various embodiments, which will not be illustrated again.

Embodiments of the above-described pixel units of the embodiments of the present disclosure are described with reference to specific structures of a substrate body 100 shown in FIGS. 1 and 2, in which four corners of each island 101 are respectively provided with one connection area 102, and each island 101 is a quadrilateral in a horizontal state. Specifically, as shown in FIG. 2, a connection area 102 is provided between every two adjacent is lands 101; wherein a first end of the connection area 102 is connected with a first top end of a first edge of a first island in two adjacent is lands; the second end of the connection area 102 is connected with the second top ends of the second edges of the two adjacent island portions; the second edge is opposite to the first edge, and the second top end is an end of the second edge far away from the first top end. With this arrangement structure, each connection area 102 is formed so as to extend between the adjacent two is lands 101, and one connection area 102 is provided between each adjacent two is lands 101, each connection area 102 connecting the structures of the two corner positions of the adjacent two is lands 101.

Further, in the above arrangement structure, on the island portion 101, the plurality of pixel groups 200 are repeatedly arranged in a first direction X parallel to the horizontal edge of the island portion 101 and a second direction Y different from the first direction X parallel to the vertical edge of the island portion 101.

It should be noted that the pixel structures provided by the above-described embodiments of the present disclosure are not limited to being provided only on the substrate body 100 of the structure shown in FIG. 2.

Figure 16:
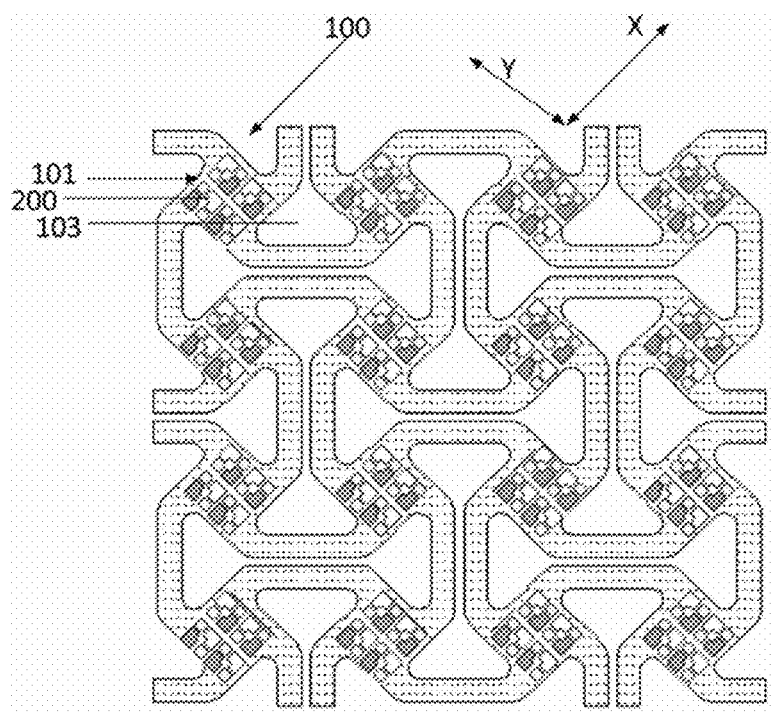
FIG. 16 is a schematic structural view of one embodiment of a substrate body in a display substrate according to an embodiment of the present disclosure.

For example, as shown in FIG. 16, on the substrate body 100 of this embodiment structure, each island 101 is quadrangular in an inclined state, and the shape of the penetrating part 103 on the substrate body 100 is different from that of FIG. 1. The first direction X and the second direction Y of the plurality of pixel groups 200 are respectively parallel to two adjacent connecting edges of the island portion 101, and when the pixel groups 200 are respectively arranged on the island portion 101 according to the pixel structure of any one embodiment, the quadrangular display area of the island portion 101 can be fully utilized.

Figure 17:
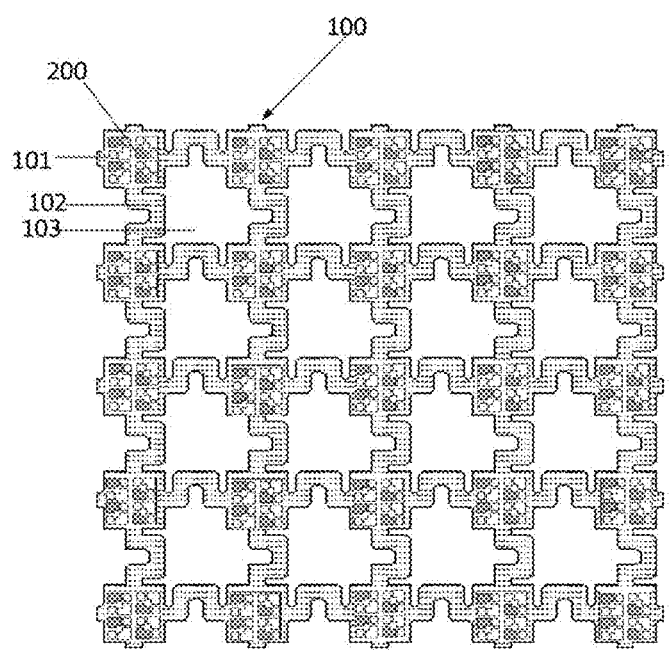
FIG. 17 is a schematic structural view of one embodiment of a substrate body in a display substrate according to an embodiment of the present disclosure.
Figure 18:
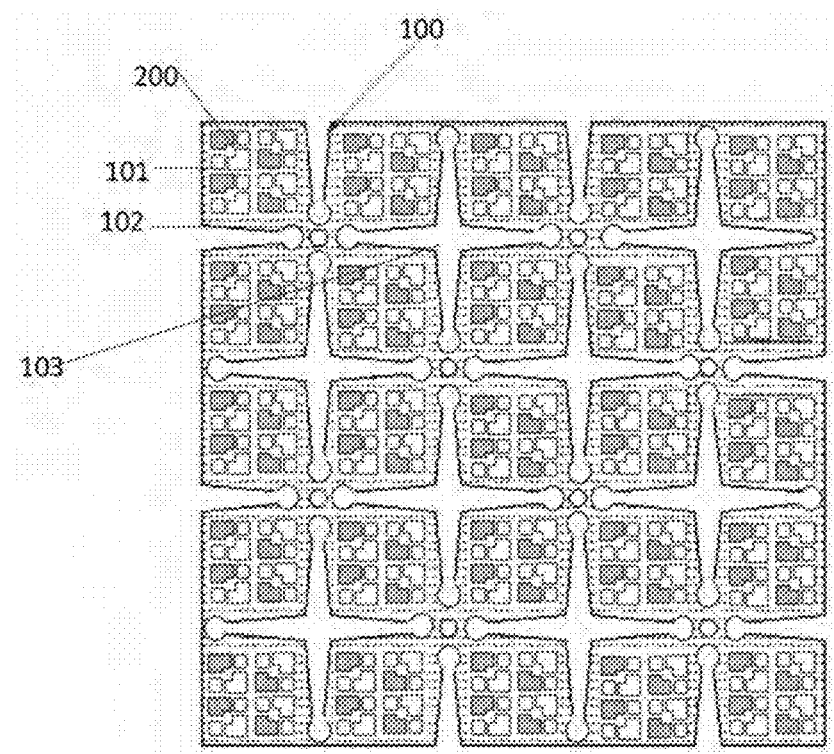
FIG. 18 is a schematic structural view of one embodiment of a substrate body in a display substrate according to an embodiment of the present disclosure.
Figure 19:
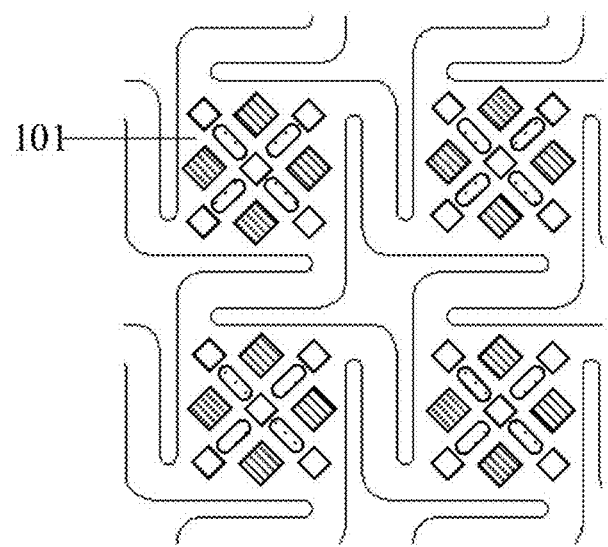
FIG. 19 is a schematic view showing a structure of one embodiment of a substrate body in a related art display substrate.

Similarly, on the substrate body 100 of the structures shown in FIGS. 17 and 18, as compared with the substrate body 100 shown in FIGS. 2 and 16 described above, although the connection area 102 to which each island 101 is connected has a different shape and the penetration portion 103 has a different shape, each island 101 is formed in a quadrilateral shape. When the pixel groups 200 are respectively arranged on the island portions 101 according to the pixel structure of any of the above embodiments, the quadrangular display area of the island portions 101 can be fully utilized. For example, as shown in FIG. 19, compared with the arrangement of the related art pixel structure, the arrangement structure of the pixel unit according to the above-described embodiment of the disclosed embodiment can effectively improve the utilization rate of the quadrangular display area on the island 101 and achieve the purpose of improving the display effect.

Embodiments of the present disclosure also provide a display device including a display substrate as in any of the above embodiments.

With the display device according to an embodiment of the present disclosure in conjunction with FIGS. 1 to 18, the substrate body includes a stretched state stretched in the first direction and/or a second direction perpendicular to the first direction, wherein the shape of the penetration portion changes when the substrate body is stretched. By changing the shape of the penetrating part, a certain stretching rate is realized, so that a stretchable display device is formed.

Based on the foregoing detailed description, those skilled in the art should be able to understand the specific structure of a display device employing the display substrate described in the embodiments of the present disclosure and will not be described in detail herein.

While the foregoing is directed to alternative embodiments of the present disclosure, it will be apparent to those skilled in the art that various modifications and variations can be made in the present disclosure without departing from the spirit or scope of the disclosure.

What is claimed is:

1. A display substrate, comprising:
a flexible substrate body comprising a plurality of island portions spaced apart from each other, a plurality of connection areas connecting the plurality of island portions, and a penetration portion penetrating the substrate body among the plurality of connection areas, wherein at least a portion of each edge of the island portion is connected with the connection area;
each island portion is respectively provided with a plurality of pixel groups, each pixel group comprises a first pixel unit and a second pixel unit which are adjacently arranged along a first direction, an arrangement of the sub-pixels in the first pixel unit is different from an arrangement of the sub-pixels in the second pixel unit, the plurality of pixel groups form an n×m arrangement on the island portion and cover the whole island portion; the first direction is a direction parallel to one edge of the island portion;
where n represents a number of the pixel groups in a row direction, m represents a number of the pixel groups in a column direction, and n and m are integers greater than or equal to 1, respectively;
wherein a shape of the penetration portion changes when the substrate body is stretched.

2. The display substrate according to claim 1, wherein both the sub-pixels within the first pixel unit and the sub-pixels within the second pixel unit are arranged to form a quadrangular pixel unit area.

3. The display substrate according to claim 2, wherein the arrangement of the sub-pixels in a mirror image of the first pixel unit mirrored along a straight line parallel to the first direction is the same as the arrangement of the sub-pixels in the second pixel unit.

4. The display substrate according to claim 2, wherein the sub-pixels within the first pixel unit and the second pixel unit are arranged to form a square pixel unit area.

5. The display substrate according to claim 4, wherein an area of the pixel unit area formed by the sub-pixels arranged in the first pixel unit is equal to an area of the pixel unit area formed by the sub-pixels arranged in the second pixel unit.

6. The display substrate according to claim 3, wherein a pixel unit arrangement area in the island portion is a quadrilateral, and the quadrangular pixel unit area formed by the combination arrangement of at least three sub-pixels within the first pixel unit included in the pixel group is matched with the pixel unit arrangement area.

7. The display substrate according to claim 6, wherein the first pixel unit comprises four sub-pixels, and at least three of the four sub-pixels have different colors;
a first sub-pixel and a second sub-pixel respectively cover two ends of a first diagonal line of a pixel unit area where the first pixel unit is located, and a third sub-pixel and a fourth sub-pixel respectively cover two ends of a second diagonal line of the pixel unit area.

8. The display substrate according to claim 7, wherein a sub-pixel of a third color within the first pixel unit is located adjacent to a sub-pixel of the third color within the second pixel unit.

9. The display substrate according to claim 7, wherein each of the four sub-pixels is a quadrilateral.

10. The display substrate according to claim 7, wherein the first sub-pixel and the second sub-pixel are both concave hexagons, and the third sub-pixel and the fourth sub-pixel are both quadrilaterals.

11. The display substrate according to claim 7, wherein the third sub-pixel and the fourth sub-pixel are sub-pixels of the same color, the first sub-pixel, the second sub-pixel and the third sub-pixel are respectively sub-pixels of different colors, an area of the third sub-pixel is equal to an area of the fourth sub-pixel, and an area of the first sub-pixel is equal to an area of the second sub-pixel.

12. The display substrate according to claim 11, wherein the area of the first sub-pixel is larger than the area of the third sub-pixel.

13. The display substrate according to claim 6, wherein the first pixel unit comprises three sub-pixels which are respectively sub-pixels of different colors;
a first sub-pixel of the three sub-pixels covers a first end of a first diagonal line of a pixel unit area where the first pixel unit is located and a first end of a second diagonal line, a second sub-pixel covers a second end of the first diagonal line of the pixel unit area, and a third sub-pixel covers a second end of the second diagonal line of the pixel unit area.

14. The display substrate according to claim 13, wherein each of the sub-pixels is a quadrilateral.

15. The display substrate according to claim 13, wherein the first sub-pixel is a concave hexagon, the second sub-pixel and the third sub-pixel are quadrilaterals.

16. The display substrate according to claim 13, wherein at least one of the three sub-pixels comprises at least two sub-pixel units of the same color.

17. The display substrate according to claim 13, wherein the area of the first sub-pixel is larger than the area of the second sub-pixel and the area of the third sub-pixel.

18. The display substrate according to claim 6, wherein the first pixel unit comprises three sub-pixels which are respectively sub-pixels of different colors;
the first sub-pixel and the second sub-pixel respectively cover two ends of the first diagonal line of the pixel unit area where the first pixel unit is located, and the third sub-pixel is arranged between the first sub-pixel and the second sub-pixel and covers the second diagonal line of the pixel unit area and is arranged along the second diagonal line.

19. The display substrate according to claim 18, wherein the first sub-pixel and the second sub-pixel are triangular; the third sub-pixel is oblong.

20. A display device, comprising the display substrate according to claim 1.

* * * * *